United States Patent
Jung

(10) Patent No.: US 11,569,467 B2
(45) Date of Patent: Jan. 31, 2023

(54) QUANTUM DOT COMPOSITION AND LIGHT EMITTING DIODE HAVING A LIGAND WITH HEAD PART THAT HAS AN ACID GROUP COMBINED WITH SURFACE OF A QUANTUM DOT

(71) Applicant: Samsung Display Co., Ltd., Yongin-si (KR)

(72) Inventor: Yunku Jung, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 248 days.

(21) Appl. No.: 16/920,730

(22) Filed: Jul. 5, 2020

(65) Prior Publication Data

US 2021/0043863 A1 Feb. 11, 2021

(30) Foreign Application Priority Data

Aug. 5, 2019 (KR) .................. 10-2019-0094819

(51) Int. Cl.
| | |
|---|---|
| *H01L 29/08* | (2006.01) |
| *H01L 51/50* | (2006.01) |
| *C09K 11/02* | (2006.01) |
| *C09K 11/06* | (2006.01) |
| *H01L 27/32* | (2006.01) |
| *H01L 51/00* | (2006.01) |
| *H01L 51/56* | (2006.01) |

(52) U.S. Cl.
CPC ............ *H01L 51/502* (2013.01); *C09K 11/02* (2013.01); *C09K 11/06* (2013.01); *H01L 27/322* (2013.01); *H01L 27/3211* (2013.01); *H01L 51/0077* (2013.01); *H01L 51/56* (2013.01); *C09K 2211/10* (2013.01); *C09K 2211/18* (2013.01)

(58) Field of Classification Search
CPC .............................. H01L 51/502; H01L 29/08
See application file for complete search history.

(56) References Cited

U.S. PATENT DOCUMENTS

| | | | |
|---|---|---|---|
| 8,242,515 B2 | 8/2012 | Kahen et al. | |
| 8,354,785 B2* | 1/2013 | Clough | .................. C09K 11/70 313/503 |
| 8,377,333 B2* | 2/2013 | Ramprasad | ......... H01L 33/0029 428/404 |

(Continued)

FOREIGN PATENT DOCUMENTS

| | | |
|---|---|---|
| CN | 106032468 | 10/2016 |
| JP | 2011502333 | 1/2011 |

(Continued)

OTHER PUBLICATIONS

David R. Baker et al., Tuning the Emission of CdSe Quantum Dots by Controlled Trap Enhancement, Langmuir Article, 2010, 26(13), pp. 11272-11276.

(Continued)

*Primary Examiner* — Caleb E Henry
(74) *Attorney, Agent, or Firm* — H.C. Park & Associates, PLC

(57) ABSTRACT

A quantum dot composition of an embodiment includes: a quantum dot; a ligand combined with a surface of the quantum dot; and a ligand scavenger having a nucleophilic reaction group.

12 Claims, 14 Drawing Sheets

(56) References Cited

U.S. PATENT DOCUMENTS

| | | | | |
|---|---|---|---|---|
| 8,404,154 | B2* | 3/2013 | Breen | C09K 11/02 |
| | | | | 428/404 |
| 8,414,800 | B2* | 4/2013 | Jang | B82B 1/00 |
| | | | | 252/500 |
| 8,947,619 | B2* | 2/2015 | Li | G02F 1/133509 |
| | | | | 313/467 |
| 8,980,133 | B2* | 3/2015 | Ramprasad | H01L 33/28 |
| | | | | 252/301.4 R |
| 9,006,753 | B2* | 4/2015 | Coe-Sullivan | H01L 51/5012 |
| | | | | 313/503 |
| 9,139,767 | B2* | 9/2015 | Dubrow | C09K 11/56 |
| 9,385,194 | B2 | 7/2016 | Cho et al. | |
| 9,793,505 | B2 | 10/2017 | Zhou et al. | |
| 2010/0264371 | A1* | 10/2010 | Nick | C09D 7/69 |
| | | | | 252/301.36 |
| 2017/0352827 | A1 | 12/2017 | Cho et al. | |
| 2018/0016495 | A1 | 1/2018 | Kim et al. | |
| 2018/0054872 | A1* | 2/2018 | Xu | H01L 51/0037 |
| 2018/0148638 | A1 | 5/2018 | Ahn et al. | |
| 2018/0264113 | A1 | 9/2018 | Naasani | |
| 2019/0044034 | A1* | 2/2019 | Hyun | C09K 11/565 |
| 2020/0332181 | A1* | 10/2020 | Zhang | C09K 11/883 |

FOREIGN PATENT DOCUMENTS

| | | |
|---|---|---|
| KR | 10-2013-0047943 | 5/2013 |
| KR | 10-1361861 | 2/2014 |
| KR | 10-1740429 | 5/2017 |
| KR | 10-1794082 | 11/2017 |
| KR | 10-2018-0008262 | 1/2018 |
| KR | 10-2018-0059363 | 6/2018 |
| KR | 10-1874413 | 7/2018 |
| KR | 10-2019-0000941 | 1/2019 |

OTHER PUBLICATIONS

Wentao Wang et al., Design of a Multi-coordinating Polymer as a Platform for Functionalizing Metal, Metal Oxide and Semiconductor Nanocrystals, Proc. of SPIE, 2016, vol. 9722, pp. 972203-1-972203-10.

Marta Liras et al., Acetyl protected thiol methacrylic polymers as effective ligands to keep quantum dots in luminescent standby mode, Polymer Chemistry, 2014, 5, pp. 437-442.

Amelie Heuer-Jungemann et al., The Role of Ligands in the Chemical Synthesis and Applications of Inorganic Nanoparticles, Chemical Reviews, 2019, 119, pp. 4819-4880.

Extended European Search Report dated Dec. 9, 2020, issued in European Patent Application No. 20188263.6.

Jung et al., Thermal Decomposition Mechanism of Single Molecule Precursors Forming Metal Sulfide Nanoparticles, Journal of the American Chemical Society, (2009), pp. 179-184.

Brown et al., Energy Level Modification in Lead Sulfide Quantum Dot Thin Films through Ligand Exchange (MIT), ACS Nano (2014), 8, 6, pp. 5863-5872.

Chuang et al., Improved performance and stability in quantum dot solar cells through band alignment engineering (MIT), Nat Mater. Aug. 2014 ; 13(8): pp. 796-780.

Wang et al., Cadmium-Free InP/ZnSeS/ZnS Heterostructure-Based Quantum Dot Light-Emitting Diodes with a ZnMgO Electron Transport Layer and a Brightness of Over 10 000 cd m-2, Small Journal, 13, 1603962 (2017), pp. 1-7.

Zhang et al., Over 100 cd A-1 Efficient Quantum Dot Light Emitting Diodes with Inverted Tandem Strudure, Adv. Fund Materials, 27, 1700610 (2017), pp. 1-8.

Zhang et al., High-Performance, Solution-Processed, and Insulating-Layer-Free Light-Emitting Diodes Based on Colloidal Quantum Dots., Adv. Materials, 30, 1801387 (2018), pp. 1-8.

Chen et al., Chloride-Passivated Mg-Doped ZnO Nanoparticles for Improving Performance of Cadmium-Free, Quantum-Dot Light-Emitting Diodes, ACS Photonics 2018, 5, pp. 3704-3711.

Kwak et al., Charaderization of Quantum Dot/Conduding Polymer Hybrid Films and Their Application in Light-Emitting Diodes, Advanced Materials; Dec. 2009, vol. 21 Issue 48, pp. 5022-5026, 5 pages.

* cited by examiner

QUANTUM DOT COMPOSITION AND LIGHT EMITTING DIODE HAVING A LIGAND WITH HEAD PART THAT HAS AN ACID GROUP COMBINED WITH SURFACE OF A QUANTUM DOT

CROSS-REFERENCE TO RELATED APPLICATIONS

This application claims priority from and the benefit of Korean Patent Application No. 10-2019-0094819, filed on Aug. 5, 2019, which is hereby incorporated by reference for all purposes as if fully set forth herein.

BACKGROUND

Field

Exemplary implementations of the invention relate generally to a quantum dot composition, and more particularly to a light emitting diode including an emission layer formed from the quantum dot composition, and a display device including the light emitting diode.

Discussion of the Background

Various types of display devices used in multimedia devices such as televisions, cellular phones, tablet computers, navigations and game consoles are being developed. In such display devices, a so-called self-luminescent display device illuminates light emitting materials including organic compounds.

The above information disclosed in this Background section is only for understanding of the background of the inventive concepts, and, therefore, it may contain information that does not constitute prior art.

SUMMARY

Applicant realized that use of a quantum dot as the light emitting material in a light emitting diode could improve color reproducibility, reliability and the life of display devices using light emitting diodes.

Compositions, and diodes and display devices including the same, made according to the principles and exemplary implementations of the invention provide a quantum dot composition for use in an emission layer of a light emitting diode that has improved luminous efficiency properties, which may be achieved by having a hydrophilic group attached on the surface of a modified quantum dot.

Additional features of the inventive concepts will be set forth in the description which follows, and in part will be apparent from the description, or may be learned by practice of the inventive concepts.

An embodiment of the inventive concept provides a quantum dot composition including a quantum dot; a ligand combined with a surface of the quantum dot; and a ligand scavenger having a nucleophilic reaction group.

In an embodiment, the ligand may include: a head combined with the surface of the quantum dot; and a tail having an alkyl group of 1 to 20 carbon atoms.

In an embodiment, the head may include a head part having a dithio acid group or a carboxylic acid group.

In an embodiment, the ligand may include at least one of HO(O)—C—NH—R, HS(S)—C—NH—R, HO(O)—C—N—R$_2$, HS(S)—C—N—R$_2$, HO(O)—C—O—R, HS(S)—C—O—R, HO(O)—C—[C(O)O—C(O)O]$_n$—H, or HS(S)—C—[C(O)O—C(O)O]$_n$—H, where R is an alkyl group of 1 to 20 carbon atoms, and n is an integer of 1 to 10.

In an embodiment, the ligand scavenger may include at least one of NH$_2$—R$_a$, NH—(R$_a$)$_2$, N—(R$_a$)$_3$, OH—R$_a$, or O—(R$_a$)$_2$, where R$_a$ is an alkyl group of 1 to 20 carbon atoms.

In an embodiment, the quantum dot composition may further include an organic solvent.

In an embodiment, the ligand scavenger and the ligand may have a molar ratio of at least about 1:1, wherein the moles of the ligand scavenger may exceed the moles of the ligand.

In an embodiment, the ligand scavenger may be configured to induce a nucleophilic attack reaction on the ligand.

In an embodiment, the quantum dot may include semiconductor nanocrystal including a core and a shell wrapping the core.

In an embodiment of the inventive concept, a light emitting diode includes: a first electrode; a hole transport region disposed on the first electrode; an emission layer disposed on the hole transport region and including a modified quantum dot having a hydrophilic group; an electron transport region disposed on the emission layer; and a second electrode disposed on the electron transport region.

In an embodiment, the modified quantum dot may include: a quantum dot including a core and a shell wrapping the core; and the hydrophilic group may be combined with a surface of the quantum dot.

In an embodiment, the hydrophilic group may include a thiol group or a hydroxyl group.

In an embodiment, the emission layer may be made from a quantum dot composition including a quantum dot, a ligand combined with a surface of the quantum dot, and a ligand scavenger having a nucleophilic reaction group, the ligand may include at least one of HO(O)—C—NH—R, HS(S)—C—NH—R, HO(O)—C—N—R$_2$, HS(S)—C—N—R$_2$, HO(O)—C—O—R, HS(S)—C—O—R, HO(O)—C—[C(O)O—C(O)O]$_n$—H, or HS(S)—C—[C(O)O—C(O)O]$_n$—H, where: R may be an alkyl group of 1 to 20 carbon atoms, and n may be an integer of 1 to 10; and the ligand scavenger may include at least one of NH$_2$—R$_a$, NH—(R$_a$)$_2$, N—(R$_a$)$_3$, OH—R$_a$, or O—(R$_a$)$_2$, where: R$_a$ may be an alkyl group of 1 to 20 carbon atoms.

In an embodiment, the emission layer may further include a residue made by reacting the ligand and the ligand scavenger.

In an embodiment, the residue may include a diamine compound or a dialkoxy compound.

In an embodiment of the inventive concept, a display device including a plurality of light emitting diodes, wherein at least some of the light emitting diodes include: a first electrode; a second electrode oppositely disposed to the first electrode; and an emission layer disposed between the first electrode and the second electrode and including a modified quantum dot having a hydrophilic group.

In an embodiment, the light emitting diodes may include: a first light emitting diode including a first modified quantum dot to emit a first color light; a second light emitting diode including a second modified quantum dot to emit a second color light having a longer wavelength than the first color light; and a third light emitting diode including a third modified quantum dot to emit a third color light having a longer wavelength than the first color light and the second color light.

In an embodiment, at least some of the first to third modified quantum dots may include: a quantum dot having a core and a shell wrapping the core; and the hydrophilic group combined with a surface of the quantum dot.

In an embodiment, the hydrophilic group may be a thiol group or a hydroxyl group.

In an embodiment, the display device further includes a color filter layer may be disposed on the light emitting diodes, wherein the color filter layer may include: a first filter to transmit the first color light, a second filter to transmit the second color light, and a third filter to transmit the third color light.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
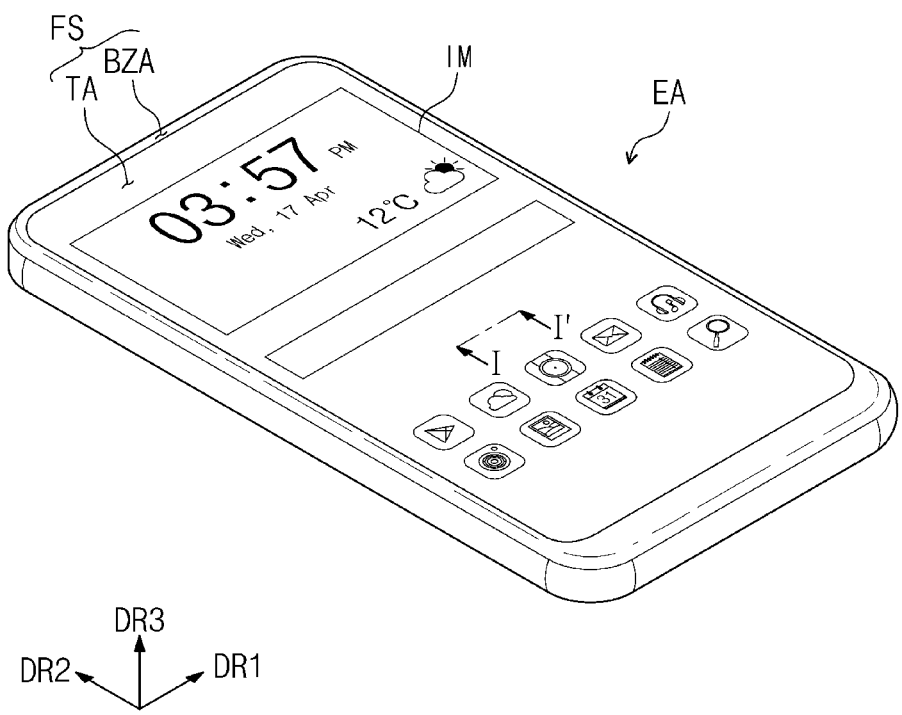
FIG. 1 is a perspective view of an embodiment of a display device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As used herein, the term "combined with" may mean a third substance formed from uniting at least two other substances, typically by a chemical reaction. As an example, the ligand may be chemically bonded to the surface of the quantum dot by processes such as chemisorption.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
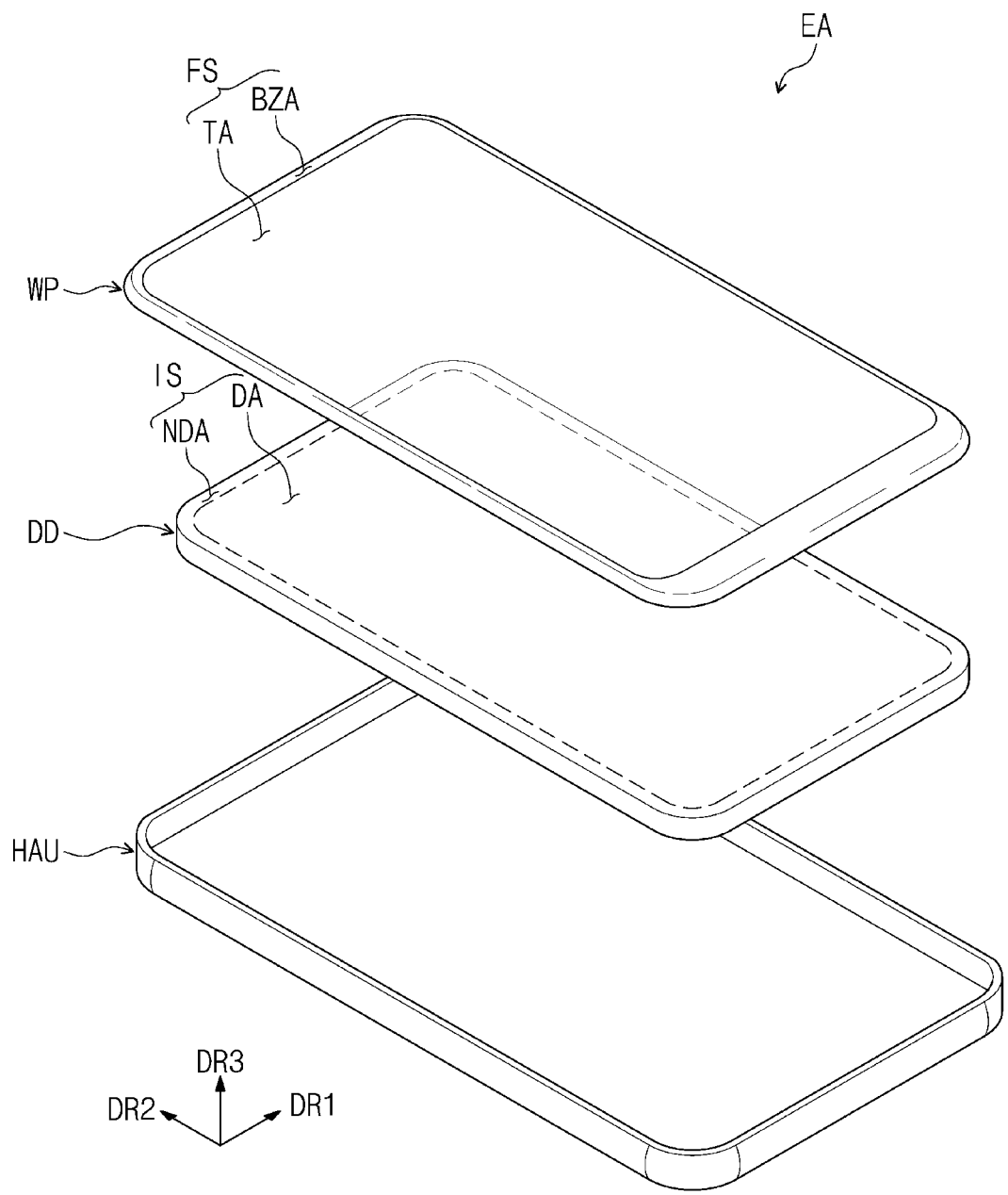
FIG. 2 is an exploded, perspective view of the display device of FIG. 1.
Figure 3:
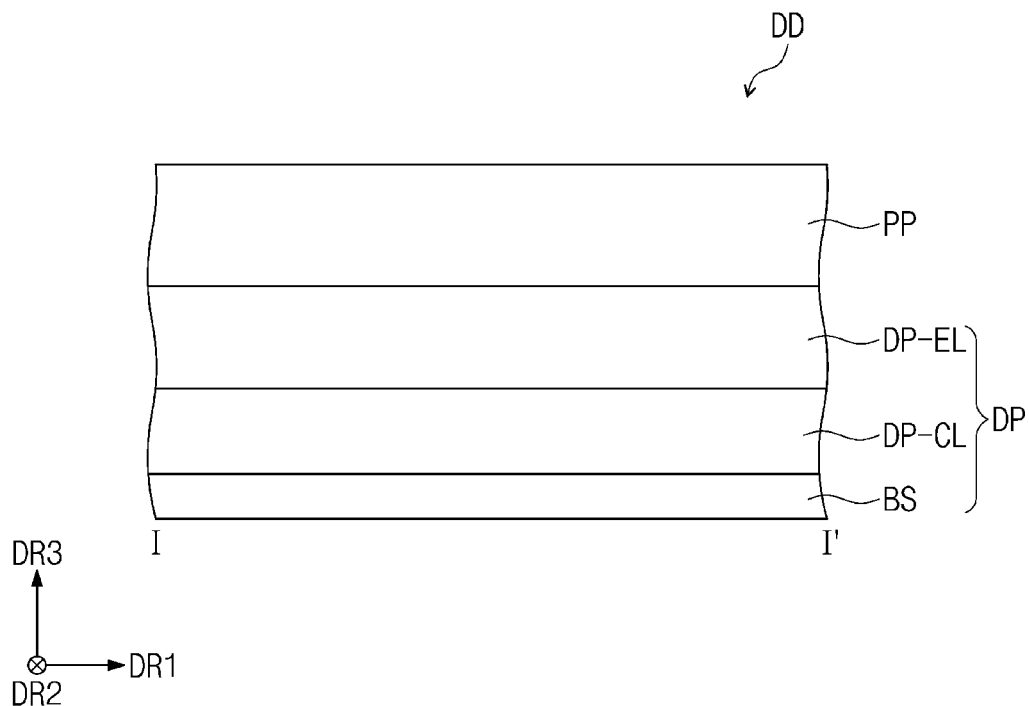
FIG. 3 is a cross-sectional view of the display device taken along line I-I' of FIG. 1.
Figure 4:
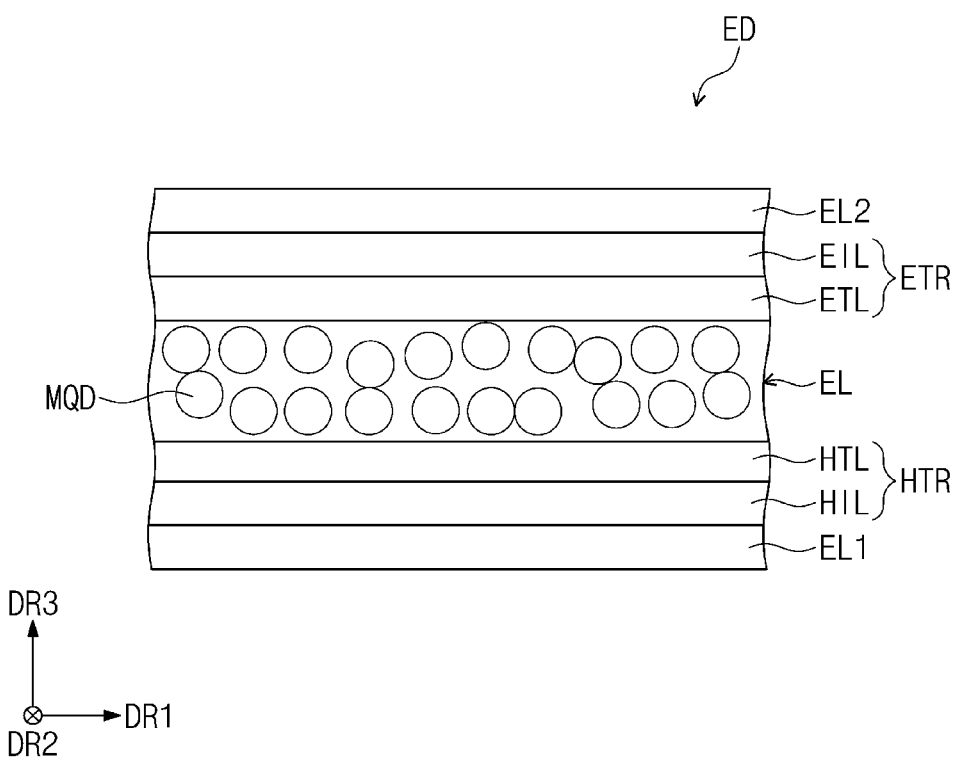
FIG. 4 is a cross-sectional view of embodiment of a light emitting diode constructed according to principles of the invention.
Figure 5:
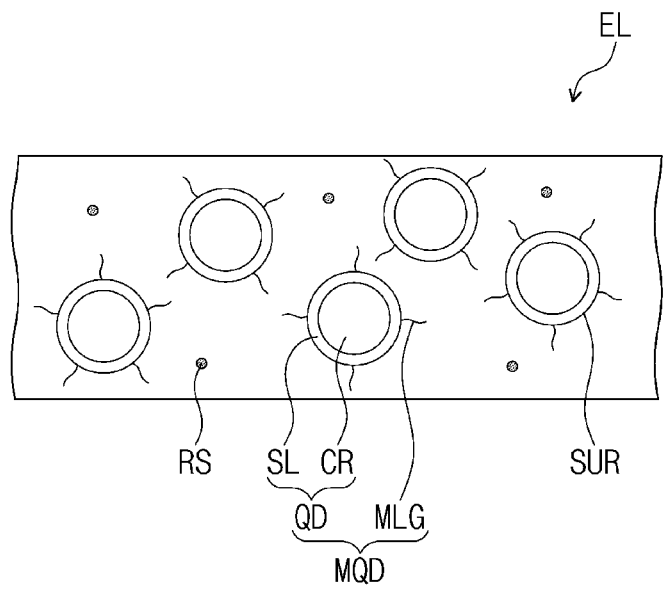
FIG. 5 is a cross-sectional view showing a portion of the light emitting diode of FIG. 4.

FIG. 1 is a perspective view of an embodiment of a display device constructed according to principles of the invention. FIG. 2 is an exploded, perspective view of the display device of FIG. 1. FIG. 3 is a cross-sectional view of the display device taken along line I-I' of FIG. 1. FIG. 4 is a cross-sectional view of embodiment of a light emitting diode constructed according to principles of the invention. FIG. 5 is a cross-sectional view showing a portion of the light emitting diode of FIG. 4.

In an embodiment, an electronic device EA may be a large-sized electronic device such as a television, a monitor and an external advertising board. In addition, the electronic device EA may be a small and medium-sized electronic device such as a personal computer, a notebook computer, a personal digital terminal, a car navigation unit, a game console, a cellular phone, a tablet and a camera. In addition, these are suggested only for illustration, and other electronic devices may be employed in embodiments of the invention. In this illustrated embodiment, a smartphone is shown as an embodiment of the electronic device EA.

The electronic device EA may include a display device DD and a housing HAU. The display device DD may display an image IM through a display surface IS. FIG. 1 shows that the display surface IS is generally parallel to a surface defined by a first direction axis DR1 and a second direction axis DR2 which crosses the first direction axis DR1. However, this is an illustration, and in another embodiment, the display surface IS of the display device DD may have a generally bent shape.

The normal line of the display surface IS, that is, a direction displaying an image IM among the thickness directions of the display device DD is indicated by a third direction axis DR3. The front surface (or top surface) and rear surface (or bottom surface) of each member may be divided by the third direction axis DR3.

A fourth direction axis DR4 (FIG. 15) may be a direction between the direction of the first direction axis DR1 and the direction of the second direction axis DR2. The fourth direction axis DR4 may be positioned on a plane which is generally parallel to a surface defined by the first direction axis DR1 and the second direction axis DR2. The directions indicated by the first to fourth direction axes DR1, DR2, DR3 and DR4 have relative concepts and may be changed to other directions.

In the electronic device EA, the display surface IS displaying the image IM may correspond to the front surface of the display device DD and may correspond to the front surface FS of a window WP. Hereinafter, the same reference symbol will be used for the display surface and the front surface of the electronic device EA, and the front surface of the window WP. The image IM may include a still image as well as a dynamic image. The electronic device EA may include a foldable display device including a folding area and a non-folding area, or a bending display device including at least one bending part.

The housing HAU may hold the display device DD. The housing HAU may be disposed to cover the display device DD so as to expose the top surface of the display surface IS of the display device DD. The housing HAU covers the side surface and the bottom surface of the display device DD and may expose the entire top surface thereof. However, the embodiments are not limited thereto, and the housing HAU may cover a portion of the top surface as well as the side surface and the bottom surface of the display device DD.

In the electronic device EA of an embodiment, the window WP may include an optically transparent insulating material. The window WP may include a transmission area TA and a bezel area BZA. The front surface FS of the window WP including the transmission area TA and the bezel area BZA corresponds to the front surface FS of the electronic device EA. A user may see images provided through the transmission area TA which corresponds to the front surface FS of the electronic device EA.

In FIG. 1 and FIG. 2, the transmission area TA is shown in a generally square shape of which corners are generally round. However, this shape is only an embodiment, and the transmission area TA may have various shapes and is not limited thereto.

The transmission area TA may be an optically transparent area. The bezel area BZA may have a relatively lower transmission ratio when compared with the transmission area TA. The bezel area BZA may have a certain color. The bezel area BZA is adjacent to the transmission area TA and may surround the transmission area TA. The bezel area BZA may define the shape of the transmission area TA. However, the embodiments are not limited thereto, and the bezel area BZA may be disposed adjacent to only one side of the transmission area TA, or a portion thereof may be omitted.

The display device DD may be disposed below the window WP. In the disclosure, the term "below" may mean an opposite direction to a direction providing images by the display device DD.

In an embodiment, the display device DD may have a configuration substantially producing images IM. In the display device DD, the images IM thus produced are displayed on the display surface IS and seen through the transmission area TA by an external user. The display device DD includes a display area DA and a non-display area NDA. The display area DA may be activated by electrical signals. The non-display area NDA may be covered by the bezel area BZA. The non-display area NDA is adjacent to the display area DA. The non-display area NDA may surround the display area DA.

The display device DD may include a display panel DP and a light controlling layer PP disposed on the display panel DP. The display panel DP may include a display device layer DP-EL. The display device layer DP-EL includes a light emitting diode ED.

The display device DD may include a plurality of light emitting diodes ED-1, ED-2 and ED-3. The light controlling layer PP may be disposed on the display panel DP and control reflected light from the display panel DP by external light. The light controlling layer PP may include, for example, a polarization layer or a color filter layer.

In the display device DD of an embodiment, the display panel DP may be an emission type display panel. For example, the display panel DP may be a quantum dot emitting display panel including a quantum dot light emitting diode. However, the embodiments are not limited thereto.

The display panel DP may include a base substrate BS, a circuit layer DP-CL disposed on the base substrate BS, and a display device layer DP-EL disposed on the circuit layer DP-CL.

The base substrate BS may be a member providing a base surface where the display device layer DP-EL is disposed. The base substrate BS may be a glass substrate, a metal substrate, a plastic substrate, etc. However, embodiments are not limited thereto, and the base substrate BS may be an inorganic layer, an organic layer or a composite material layer. The base substrate BS may be a flexible substrate which may be easily bent or folded.

In an embodiment, the circuit layer DP-CL may be disposed on the base substrate BS, and the circuit layer DP-CL may include a plurality of transistors. The transistors each may include a control electrode, an input electrode, and an output electrode. For example, the circuit layer DP-CL may include a switching transistor and a driving transistor for driving the light emitting diode ED of the display device layer DP-EL.

FIG. 4 is a diagram showing a light emitting diode ED according to an embodiment, and referring to FIG. 4, the light emitting diode ED according to an embodiment includes a first electrode EL1, a second electrode EL2 opposite to the first electrode EL1, and a plurality of functional layers disposed between the first electrode EL1 and the second electrode EL2 and including an emission layer EL.

The plurality of the functional layers may include a hole transport region HTR disposed between the first electrode EL1 and the emission layer EL, and an electron transport region ETR disposed between the emission layer EL and the second electrode EL2. A capping region may be further disposed on the second electrode EL2 in an embodiment.

The hole transport region HTR and the electron transport region ETR may each include at least one sub functional layer. For example, the hole transport region HTR may include at least one of a hole injection layer HIL or a hole transport layer HTL as the sub functional layer, and the electron transport region ETR may include at least one of an electron injection layer EIL or an electron transport layer ETL as the sub functional layer.

The hole transport region HTR may be formed as one functional layer, for example, the hole transport region HTR may include only the hole injection layer HIL or the hole transport layer HTL. In addition, the electron transport region ETR may be formed as one functional layer, for example, the electron transport region ETR may include only the electron injection layer EIL or the electron transport layer ETL. Embodiments are not limited thereto, but the hole transport region HTR may further include an electron blocking layer, etc., as the sub functional layer, and the electron transport region ETR may further include a hole blocking layer as the sub functional layer.

In the light emitting diode ED according to an embodiment, the first electrode EL1 has conductivity. The first electrode EL1 may be formed using a metal alloy or a conductive compound. The first electrode EL1 may be an anode. The first electrode EL1 may be a pixel electrode.

In the light emitting diode ED according to an embodiment, the first electrode EL1 may be a reflective electrode. However, the embodiments are not limited thereto. For example, the first electrode EL1 may be a transmissive electrode, or a transflective electrode. If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Alternatively, the first electrode EL1 may have a multilayered structure including a reflective layer or a transflective layer formed using the above-described materials, and a transparent conductive layer formed using indium tin oxide (ITO), indium zinc oxide (IZO), zinc oxide (ZnO), indium tin zinc oxide (ITZO), etc. For example, the first electrode EL1 may be a multilayered metal layer and may have a laminated structure of metal layers of ITO/Ag/ITO.

The hole transport region HTR is disposed on the first electrode EL1. The hole transport region HTR may include a hole injection layer HIL, a hole transport layer HTL, etc. In addition, the hole transport region HTR may further include at least one of a hole buffer layer and an electron blocking layer in addition to the hole injection layer HIL and the hole transport layer HTL. The hole buffer layer may compensate an optical resonance distance according to the wavelength of light emitted from the emission layer EL and may increase light emission efficiency. Materials that may be included in the hole transport region HTR may be used as materials in the hole buffer layer. The electron blocking layer is a layer playing the role of blocking the electron injection from the electron transport region ETR to the hole transport region HTR.

The hole transport region HTR may have a single layer formed using a single material, a single layer formed using a plurality of different materials, or a multilayer structure including a plurality of layers formed using a plurality of different materials. For example, the hole transport region HTR may have a structure of a single layer formed using a plurality of different materials or a structure laminated from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, hole buffer layer/hole transport layer HTL, hole injection layer HIL/hole transport layer HTL/electron blocking layer, hole buffer layer/hole injection layer HIL/hole transport layer HTL, etc. However, the embodiments are not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole injection layer HIL may include, for example, a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4''-tris(3-methylphenylphenylamino)triphenylamine (m-MTDATA), 4,4',4''-tris(N,N-diphenylamino)triphenylamine (TDATA), 4,4',4''-tris{N,-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, and dipyrazino[2,3-f: 2',3'-h]quinoxaline-2,3,6,7,10,11-hexacarbonitrile (HAT-CN).

The hole transport layer HTL may include, for example, carbazole derivatives such as N-phenyl carbazole and polyvinyl carbazole, fluorene based derivatives, N,N'-bis(3-methylphenyl)-N,N'-diphenyl-[1,1-biphenyl]-4,4'-diamine (TPD), triphenylamine-based derivatives such as 4,4',4'-tris(N-carbazolyl)triphenylamine (TCTA), N,N-di(naphtalene-1-yl)-N,N-diphenyl-benzidine (NPB), 4,4'-cyclohexylidene bis[N,N-bis(4-methylphenyl)benzenamine](TAPC), 4,4'-bis[N,N'-(3-tolyl)amino]-3,3'-dimethylbiphenyl (HMTPD), 1,3-bis(N-carbazolyl)benzene (mCP), etc.

The electron transport region ETR is disposed on the emission layer EL. In the light emitting diode ED of an embodiment, the emission layer EL may include a modified quantum dot MQD. The modified quantum dot MQD included in the emission layer EL may be a quantum dot QD which is combined with a hydrophilic group MLG at the surface thereof. The modified quantum dot MQD includes a functional group which is a hydrophilic group MLG attached on the surface thereof and may have modified surface properties.

The quantum dot QD forming the modified quantum dot MQD may include a core CR and a shell SL wrapping the core CR. The hydrophilic group MLG may be combined at the surface of the shell SL which is the surface of the quantum dot QD.

The functional group which is the hydrophilic group MLG may be derived from the reaction of a ligand which is combined at the surface of the quantum dot and a ligand scavenger in a quantum dot composition, further described below. The hydrophilic group MLG may be derived from the nucleophilic attack reaction of the ligand and the ligand scavenger. For example, the hydrophilic group MLG may include a thiol group (*—SH) or a hydroxyl group (*—OH) and as used herein, "*—" means a connecting position.

In the light emitting diode ED of an embodiment, the emission layer EL may be formed from the quantum dot composition of an embodiment. The quantum dot composition of an embodiment may include a quantum dot, a ligand combined at the surface of the quantum dot, and a ligand scavenger.

The emission layer EL may include a plurality of modified quantum dots MQD. The modified quantum dots MQD included in the emission layer EL may be laminated to form a layer. In FIG. 4, illustrated are approximately two layers formed by arranging the modified quantum dots MQD which form, for example, a generally circular cross-section. However, embodiments are not limited thereto. For example, the arrangement of the modified quantum dots MQD may be changed according to the thickness of the emission layer EL, the shape of the quantum dot QD included in the emission layer EL, an average diameter of the quantum dots QD, etc. Particularly, in the emission layer EL, the modified quantum dots MQD may be arranged in neighboring relation to form one layer or may be arranged to form a plurality of layers including two layers, three layers, or the like.

The emission layer EL may have a thickness of, for example, about 5 nm to about 20 nm, or about 10 nm to about 20 nm. The emission layer EL includes a modified quantum dot MQD formed from the quantum dot composition of an embodiment as described above. In addition, the emission layer EL may include a small amount of residue RS derived from the reaction of the ligand and the ligand scavenger of the quantum dot composition of an embodiment. The residue RS may be a material produced by the nucleophilic attack reaction of the ligand and the ligand scavenger of the quantum dot composition. The residue RS may be a diamine compound or a dialkoxy compound.

In the light emitting diode ED of an embodiment, the modified quantum dot MQD included in the emission layer EL may be at least one surface modified quantum dot QD. The quantum dot QD included in the emission layer EL of an embodiment may be a semiconductor nanocrystal which may be selected from a II-VI group compound, a group compound, a III-V group compound, a IV-VI group compound, a IV group element, a IV group compound, and a combination thereof.

The II-VI group compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The I-III-VI group compound may be selected from a ternary compound selected from the group consisting of $AgInS_2$, $CuInS_2$, $AgGaS_2$, $CuGaS_2$, and a mixture thereof, or a quaternary compound such as $AgInGaS_2$ and $CuInGaS_2$.

The III-V group compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The III-V group compound may further include a metal in group II. For example, InZnP, etc., may be selected as the III-II-V group compound.

The IV-VI group compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The IV group element may be selected from the group consisting of Si, Ge, and a mixture thereof. The IV group compound may be a binary compound selected from the group consisting of SiC, SiGe, and a mixture thereof.

In some embodiments, the binary compound, the ternary compound or the quaternary compound may be present at uniform concentration in a particle or may be present at a partially different concentration distribution state in the same particle. In addition, a core-shell structure in which one quantum dot wraps another quantum dot may be possible. The interface of the core and the shell may have a concentration gradient in which the concentration of an element present in the shell is decreased toward a center.

In some embodiments, the quantum dot QD may have a core-shell structure including a core including a nanocrystal and a shell wrapping the core. The shell of the quantum dot QD having the core-shell structure may play the role of a protection layer for preventing the chemical deformation of the core to maintain semiconductor properties and/or a charging layer for imparting the quantum dot QD with electrophoretic properties. The shell may have a single layer or a multilayer. The interface of the core and the shell may have a concentration gradient in which the concentration of an element present in the shell is decreased toward a center. Examples of the shell of the quantum dot QD having the core-shell structure may include a metal or non-metal oxide, a semiconductor compound, or a combination thereof.

For example, the metal or non-metal oxide may include a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$ and $NiO$, or a ternary compound such as $MgAl_2O_4$, $CoFe_2O_4$, $NiFe_2O_4$ and $CoMn_2O_4$, but the embodiments are not limited thereto.

Also, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, is AlSb, etc., but embodiments are not limited thereto.

The quantum dot QD may have a full width of half maximum (FWHM) of emission wavelength spectrum of no more than about 45 nm, preferably, no more than about 40 nm, more preferably, no more than about 30 nm. Within this range, color purity or color reproducibility may be improved. In addition, light emitted via such quantum dot is emitted in all directions, and light view angle properties may be improved.

In addition, the shape of the quantum dot QD may have generally used shapes in the art, without specific limitation. More particularly, the one or more generally spherical, pyramidal, multi-arm, cubic nanoparticle, nanotube, nanowire, nanofiber, nanoplate particle, etc. shapes may be used.

The quantum dot QD may control the color of emitting light according to the particle size, and accordingly, the quantum dot QD may have various emission colors such as blue, red and green. With the decrease of the particle size of the quantum dot QD, light in the short wavelength region may be emitted. For example, in the quantum dots QD having the same core, the particle size of the quantum dot emitting green light may be smaller than the particle size of the quantum dot emitting red light. In addition, in the quantum dots QD having the same core, the particle size of the quantum dot emitting blue light may be smaller than the particle size of the quantum dot emitting green light. However, the embodiments are not limited thereto, and the particle size may be controlled according to the forming material of a shell and the thickness of a shell in the quantum dots QD having the same core.

In case where the quantum dot QD has diverse emitting colors including blue, red, green, etc., quantum dots QD having different emitting colors may have different core materials from each other.

In addition, in the light emitting diode ED of an embodiment, the emission layer EL may include a host and a dopant. In an embodiment, the emission layer EL may include the quantum dot QD as a dopant material. In addition, in an embodiment, the emission layer EL may further include a host material.

In the light emitting diode ED of an embodiment, the emission layer EL may emit fluorescence. For example, the quantum dot QD may be used as a fluorescence dopant material.

The emission layer EL may be formed by using various methods such as a vacuum deposition method, a spin coating method, a cast method, a Langmuir-Blodgett (LB) method, an inkjet printing method, a laser printing method, and a laser induced thermal imaging (LITI) method. For example, the emission layer EL may be formed by providing a quantum dot composition of an embodiment by an inkjet printing method.

In the light emitting diode ED of an embodiment, the electron transport region ETR is provided on the emission layer EL. The electron transport region ETR may include at least one of a hole blocking layer, an electron transport layer ETL or an electron injection layer EIL. However, the embodiments are not limited thereto.

The electron transport region ETR may have a single layer formed using a single material, a single layer formed using a plurality of different materials, or a multilayer structure having a plurality of layers formed using a plurality of different materials.

For example, the electron transport region ETR may have the structure of a single layer such as an electron injection layer EIL and an electron transport layer ETL, and may have a structure of a single layer formed using an electron injection material and an electron transport material. In addition, the electron transport region ETR may have a single layer structure formed using a plurality of different materials, or a structure laminated from the emission layer EL of electron transport layer ETL/electron injection layer EIL, or hole blocking layer/electron transport layer ETL/electron injection layer EIL, without limitation. The thickness of the electron transport region ETR may be, for example, from about 200 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

If the electron transport region ETR includes an electron transport layer ETL, the electron transport region ETR may include an anthracene-based compound. However the embodiments are not limited thereto, and the electron transport region may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate (Bebq2), 9,10-di(naphthalene-2-yl)anthracene (ADN), or a mixture thereof. The thickness of the electron transport layer ETL may be from about 100 Å to about 1,000 Å and may be, for example, from about 150 Å to about 500 Å. If the thickness of the electron transport layer ETL satisfies the above-described range, satisfactory electron transport properties may be obtained without substantial increase of a driving voltage.

If the electron transport region ETR includes the electron injection layer EIL, the electron transport region ETR may include a metal halide, a metal in lanthanides, or a co-deposited material of the metal halide and the metal in lanthanides. The metal halide may be an alkali metal halide. For example, the electron transport region ETR may include LiF, lithium quinolate (Liq), $Li_2O$, BaO, NaCl, CsF, Yb, RbCl, RbI, KI, KI:Yb etc. However, embodiments are not limited thereto. The electron injection layer EIL may also be formed using a mixture material of an electron transport material and an insulating organo metal salt. For example, the organo metal salt may include metal acetates, metal benzoates, metal acetoacetates, metal acetylacetonates, or metal stearates. The thickness of the electron injection layer EIL may be from about 1 Å to about 100 Å, and from about 3 Å to about 90 Å. If the thickness of the electron injection layer EIL satisfies the above described range, satisfactory electron injection properties may be obtained without inducing substantial increase of a driving voltage.

The electron transport region ETR may include a hole blocking layer as described above. The hole blocking layer may include, for example, at least one of 2,9-dimethyl-4,7-diphenyl-1,10-phenanthroline (BCP), or 4,7-diphenyl-1,10-phenanthroline (Bphen). However, embodiments are not limited thereto.

The second electrode EL2 is provided on the electron transport region ETR. The second electrode EL2 may be a common electrode or a cathode. The second electrode EL2 may be a transmissive electrode, a transflective electrode or a reflective electrode. If the second electrode EL2 is the transmissive electrode, the second electrode EL2 may be formed using a transparent metal oxide, for example, an indium tin oxide (ITO), an indium zinc oxide (IZO), a zinc oxide (ZnO), an indium tin zinc oxide (ITZO), etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Alternatively, the second electrode EL2 may have a multilayered structure including a reflective layer or a transflective layer formed using the above-described materials, and a transparent conductive layer formed using ITO, IZO, ZnO, ITZO, etc.

The second electrode EL2 may be connected with an auxiliary electrode. If the second electrode EL2 is connected with the auxiliary electrode, the resistance of the second electrode EL2 may be decreased.

Figure 6:
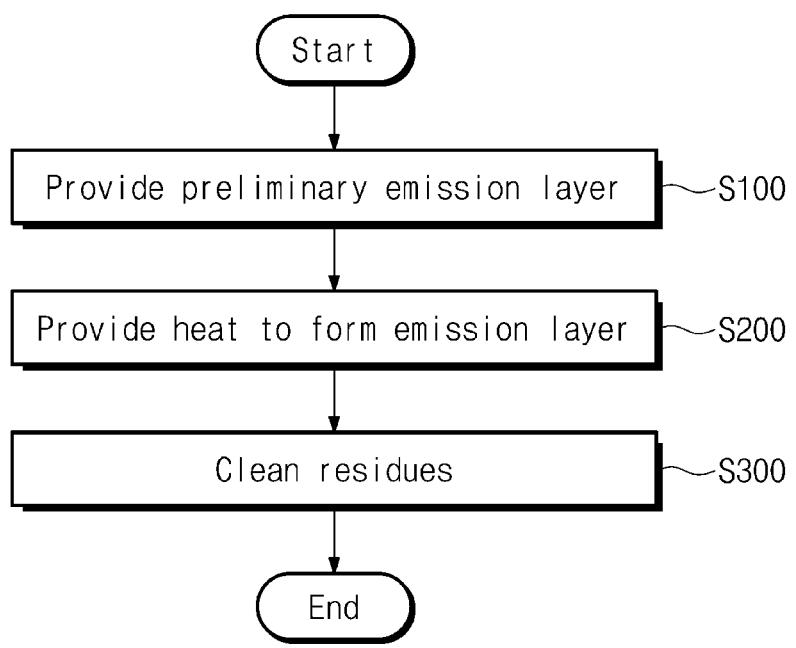
FIG. 6 is a flowchart illustrating an exemplary method for manufacturing a light emitting diode according to principles of the invention.
Figure 7:
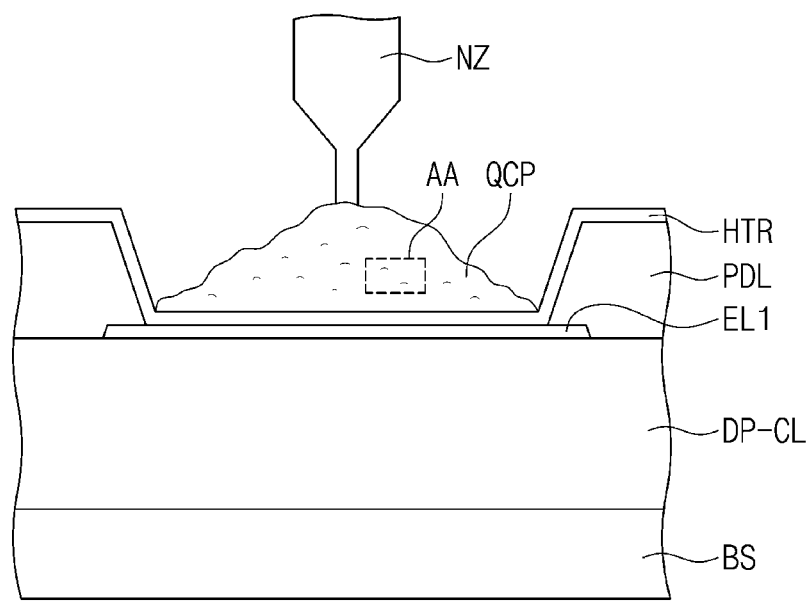
FIG. 7 is a schematic diagram showing a partial step of the exemplary method of FIG. 6.
Figure 8:
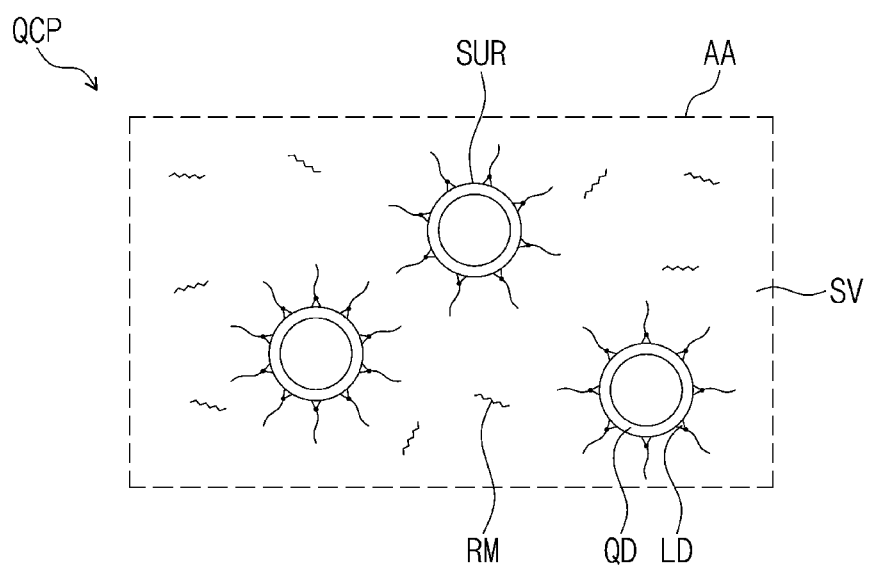
FIG. 8 is a schematic diagram of an exemplary embodiment illustrating a quantum dot composition of an area AA of FIG. 7 constructed according to principles of the invention.
Figure 9:
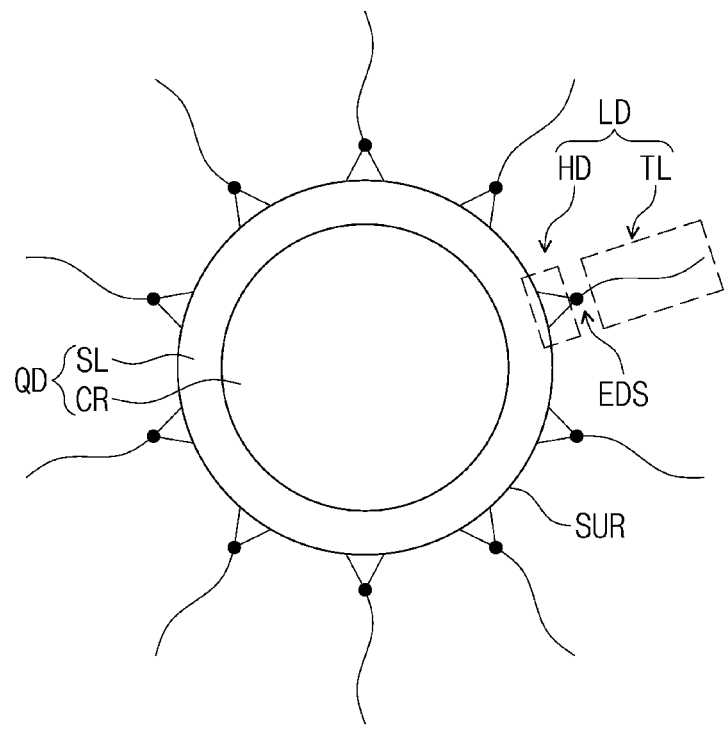
FIG. 9 is a schematic diagram showing a portion of the quantum dot composition of FIG. 8.
Figure 10:
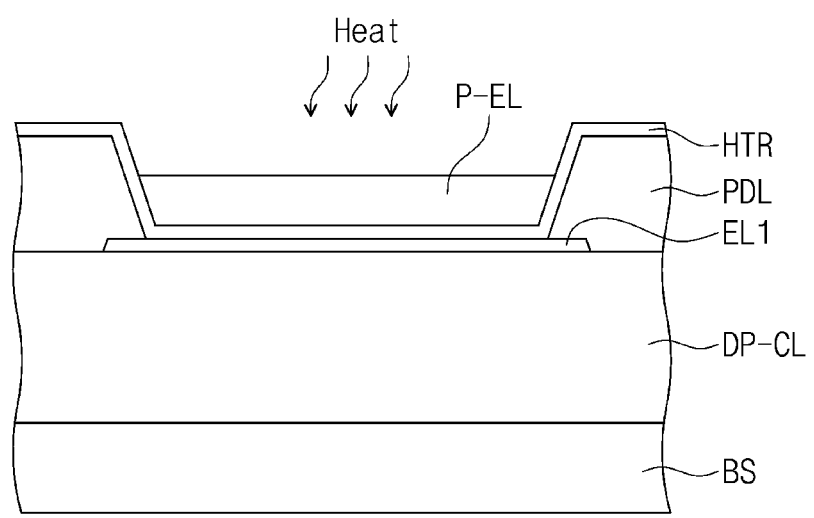
FIG. 10 is a schematic diagram showing another partial step of the exemplary method of FIG. 6.
Figure 11:
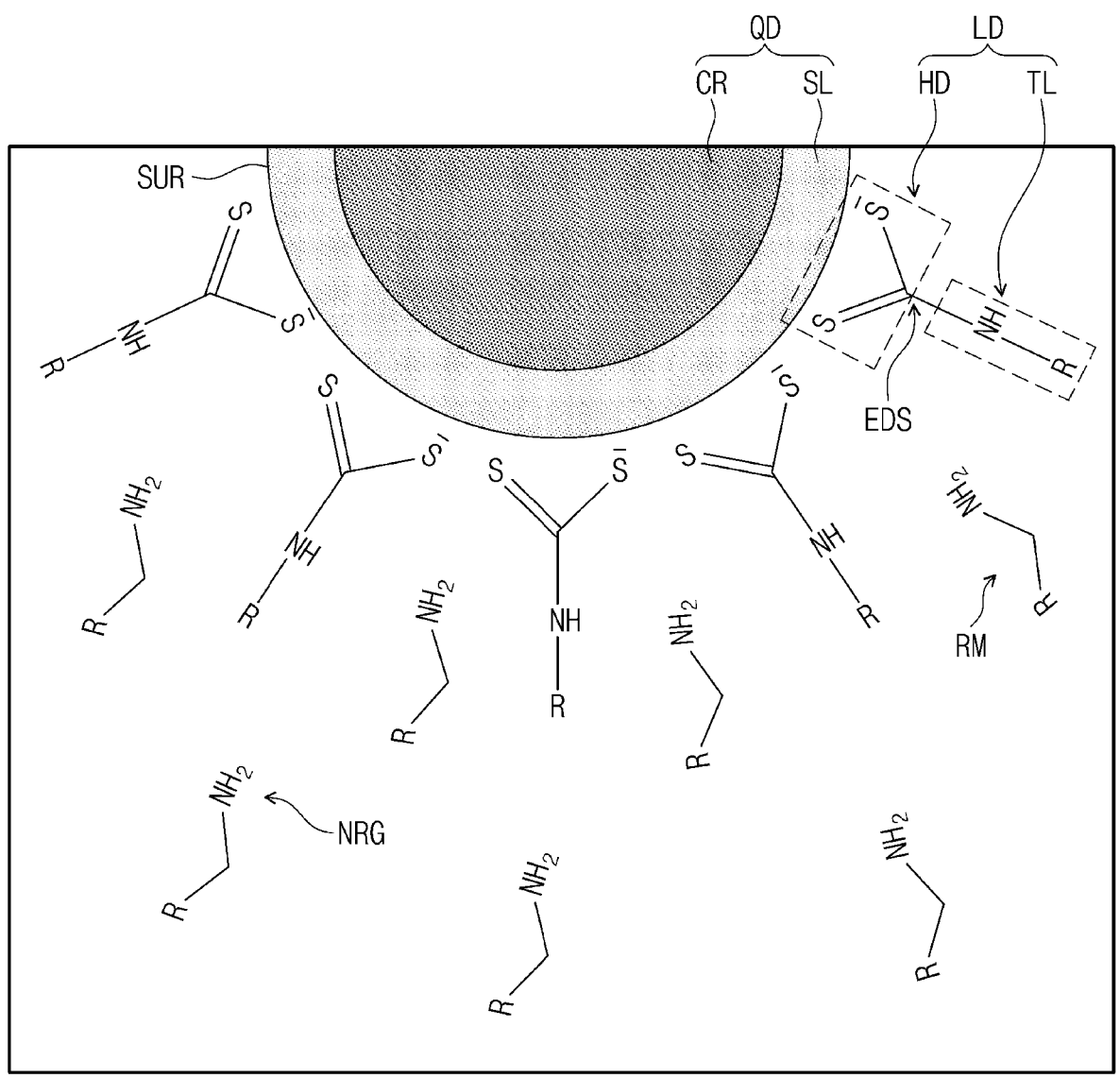
FIG. 11 is a schematic diagram illustrating an embodiment of a quantum dot composition constructed according to principles of the invention.
Figure 12:
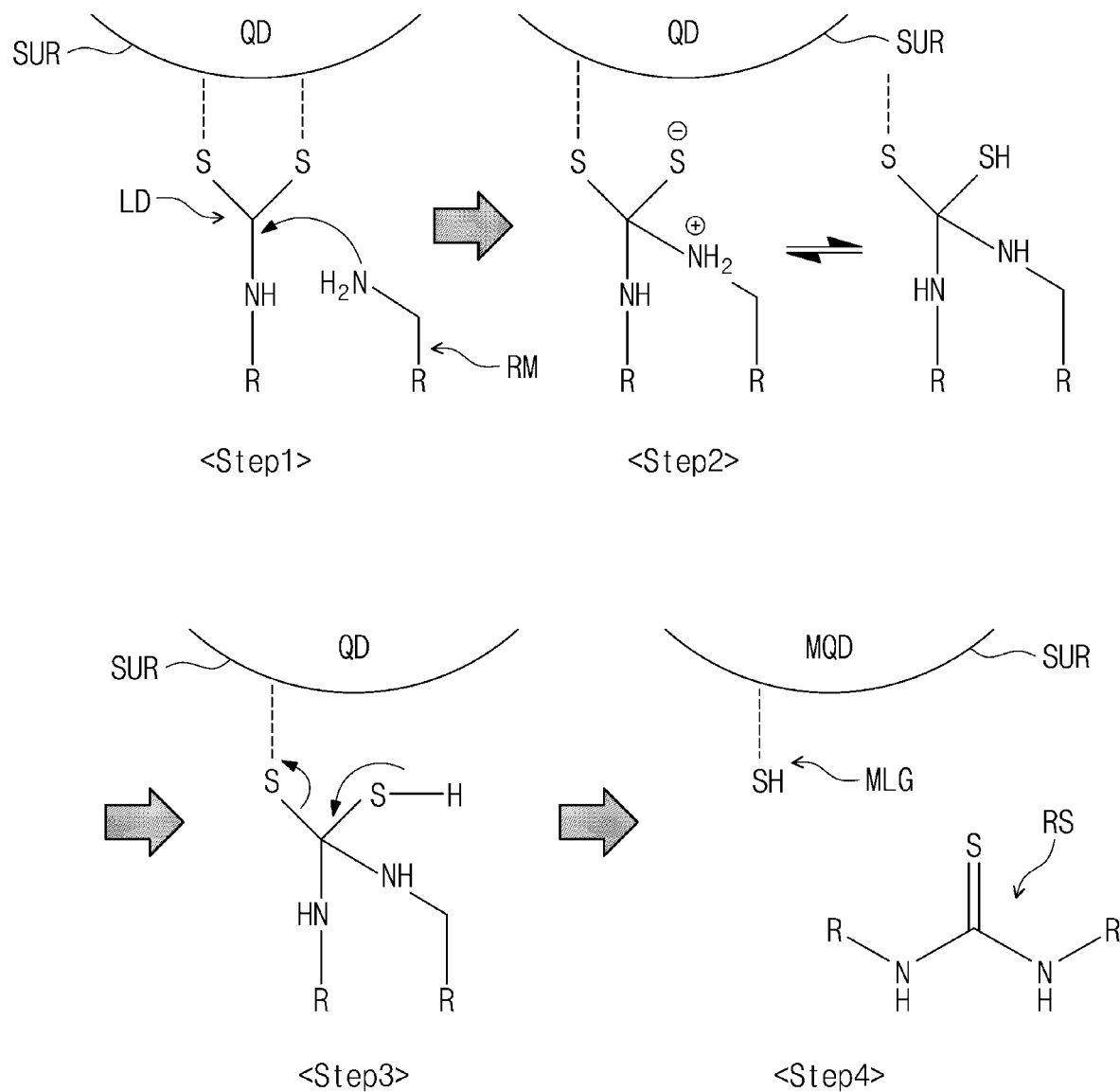
FIG. 12 is a schematic diagram illustrating a reaction step of a ligand scavenger and a ligand in the quantum dot composition of FIG. 11.

FIG. 6 is a flowchart illustrating an exemplary method for manufacturing a light emitting diode according to principles of the invention. FIG. 7 is a schematic diagram showing a partial step of the exemplary method of FIG. 6. FIG. 8 is a schematic diagram of an embodiment illustrating a quantum dot composition of an area AA of FIG. 7 constructed according to principles of the invention. FIG. 9 is a schematic diagram showing a portion of the quantum dot composition of FIG. 8. FIG. 10 is a schematic diagram showing another partial step of the exemplary method of FIG. 6. FIG. 11 is a schematic diagram illustrating an embodiment of a quantum dot composition constructed according to principles of the invention. FIG. 12 is a schematic diagram illustrating a reaction step of a ligand scavenger and a ligand in the quantum dot composition of FIG. 11.

The method for manufacturing a light emitting diode according to an embodiment may include a step of providing a preliminary emission layer (S100), a step of providing heat to form an emission layer (S200), and a step of cleaning residues (S300).

FIG. 7 schematically illustrates a step of providing a preliminary emission layer (S100) in the method for manufacturing a light emitting diode according to an embodiment. The step of providing a preliminary emission layer (S100) may be a step of providing a quantum dot composition QCP on a hole transport region HTR. The quantum dot composition QCP may be provided in a pixel defining layer PDL through a nozzle NZ. The hole transport region HTR is provided as a common layer overlapping with the pixel defining layer PDL in FIG. 7, but embodiments are not limited thereto. The hole transport region HTR may be provided in the pixel defining layer PDL. For example, the hole transport region HTR may be provided in the pixel defining layer PDL using an inkjet printing method.

FIG. 8 illustrates a portion (area "AA") of the quantum dot composition QCP provided in FIG. 7 in more detail. FIG.

9 schematically illustrates a quantum dot QD and a ligand LD which is combined at the surface of the quantum dot QD.

The quantum dot composition QCP of an embodiment may include a quantum dot QD, a ligand LD which is combined at the surface of the quantum dot QD, and a ligand scavenger RM which has a nucleophilic reaction group NRG, as depicted in FIG. 11.

The quantum dot QD may include a core CR and a shell SL wrapping the core CR. However, embodiments are not limited thereto, but the quantum dot QD may have a single layer structure or a plurality of shells. For the quantum dots QD included in the quantum dot composition QCP of an illustrated embodiment, the same explanation on the quantum dot QD explained in the light emitting diode ED of an illustrated embodiment referring to FIG. 4 and FIG. 5, may be applied.

The ligand LD may include a head part HD which is combined at the surface of the quantum dot QD and a tail part TL which is connected with the head part HD. The ligand LD may include a head part HD which is attached to the surface of the quantum dot QD and a tail part TL which is exposed to the outside. The ligand LD may include an electron-deficient linker EDS. The electron-deficient linker EDS of the ligand LD may be subject to a nucleophilic attack by a ligand scavenger RM, as explained hereinafter. The electron-deficient linker EDS may be a connected part of the head part HD and the tail part TL of the ligand LD.

In an embodiment, the ligand LD may be an organic ligand which is an organic material. In an embodiment, the tail part TL of the ligand LD may be an alkyl group of 1 to 20 carbon atoms. In addition, the head part HD of the ligand LD may include a dithioic acid group or a carboxylic acid group.

For example, in the quantum dot composition QCP of an embodiment, the ligand LD may include at least one of HO(O)—C—NH—R, HS(S)—C—NH—R, HO(O)—C—N—R$_2$, HS(S)—C—N—R$_2$, HO(O)—C—O—R, HS(S)—C—O—R, HO(O)—[C4C(O)O—C(O)O]$_n$—H, or HS(S)—C-[C(O)O—C(O)O]$_n$—H. In the above-described material of the ligand LD, R may be an alkyl group of 1 to 20 carbon atoms and n may be an integer of 1 to 10.

The ligand LD may be represented by any one among Formulae LD-1 to LD-3 below. In LD-1 to LD-3, X may be O or S and R may be an alkyl group of 1 to 20 carbon atoms.

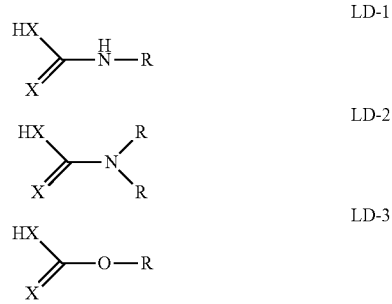

In the quantum dot composition QCP of an embodiment, the ligand scavenger RM may include at least one among NH$_2$-R$_a$, NH—(R$_a$)$_2$, N—(R$_a$)$_3$, OH—R$_a$, and O—(R$_a$)$_2$, where R$_a$ may be an alkyl group of 1 to 20 carbon atoms.

In addition, in the ligand scavenger RM, the nucleophilic reaction group NRG may be *—NH$_2$, *—NH, *—N, *—OH, or *—O.

The quantum dot composition QCP of an embodiment may further include an organic solvent SV. For example, the organic solvent SV may include hexane, toluene, trichloromethane, dimethyl sulfoxide, or dimethylformamide. However, the embodiments are not limited thereto.

The quantum dot QD may be dispersed in the organic solvent SV. The ligand LD may be combined at the surface SUR of the quantum dot QD, and to facilitate the combination, the dispersibility of the quantum dot QD in the organic solvent SV may be increased.

In the quantum dot composition QCP of an embodiment, the molar ratio of the ligand LD and the ligand scavenger RM may be about 1:1 or more. For example, the ligand scavenger RM may be included in the same molar ratio as the ligand LD, or the ligand scavenger RM may be included in a greater molar ratio than the ligand LD so as to effectively remove the tail part TL from the ligand LD.

In the method for manufacturing the light emitting diode according to some embodiments, the step of providing a preliminary emission layer (S100) may be a step of providing a quantum dot composition QCP including a quantum dot QD, a ligand LD attached onto the surface SUR of the quantum dot QD, and a ligand scavenger RM on a hole transport region HTR to form a preliminary emission layer P-EL.

FIG. 10 is a diagram schematically showing a step of providing heat to form an emission layer (S200) in the method for manufacturing a light emitting diode according to some embodiments. In FIG. 10, a step of providing heat to a preliminary emission layer P-EL is shown. The step of providing heat to the preliminary emission layer P-EL may be a step of providing heat of a temperature of about 50° C. or higher to the preliminary emission layer P-EL for baking. The baking may be the removing of the organic solvent SV, etc., included in the quantum dot composition QCP. For example, the step of providing heat to the preliminary emission layer P-EL may be a step of providing heat of a temperature of about 100° C. or higher to the preliminary emission layer P-EL to remove the organic solvent SV included in the preliminary emission layer P-EL and induce nucleophilic attack reaction between the ligand scavenger RM and the ligand LD.

FIG. 11 exemplifies a quantum dot QD, a ligand LD which is combined at the surface SUR of the quantum dot, and a ligand scavenger RM, provided in the preliminary emission layer P-EL. In FIG. 11, the quantum dot QD may include a core CR and a shell SL. The ligand LD may include a head part HD combined with the quantum dot QD and a tail part TL exposed to the outside. The head part HD may be the derivative of a dithioic acid group and the tail part TL may be an alkylamine group. The ligand scavenger RM may be an amine compound including R which is an alkyl group of 6 to 10 carbon atoms.

FIG. 12 illustrates steps for providing a modified quantum dot by modifying a ligand attached to the surface of a quantum dot in a quantum dot composition of some embodiments.

The steps of <Step 1> to <Step 4> shown in FIG. 12, although not being bound by theory, represent the steps of the nucleophilic attack reaction between an amine compound which is a ligand scavenger RM and a ligand LD material attached to the surface SUR of the quantum dot QD.

In FIG. 12, the amine compound

which is the ligand scavenger RM reacts with the ligand LD which is attached to the surface SUR of the quantum dot QD and combined with a part corresponding to the tail part TL in the ligand LD to form a residue RS and to be detached from the surface SUR of the quantum dot QD. In FIG. 12, the residue RS corresponds to a diamine compound

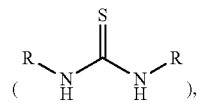

where "R" in the ligand scavenger RM and the residue, shown in FIG. 12, may be an alkyl group. For example, "R" may be an alkyl group of 1 to 20 carbon atoms. Particularly, "R" may be an alkyl group of 6 to 10 carbon atoms.

By the nucleophilic attack reaction, only a thiol group (*—SH) remains at the surface SUR of the quantum dot QD. That is, only hydrophilic functional groups MLGs formed by including a portion of the head part HD of the ligand material are combined at the surface SUR of the quantum dot QD, and most of the ligand material is combined with the ligand scavenger RM and removed so that the quantum dot QD may be formed into a modified quantum dot MQD. The tail part TL of the ligand LD which is an organic material is removed from the modified quantum dot MQD, and in some embodiments where the modified quantum dot is used in a light emitting diode, the inhibiting degree of charge injection induced by the ligand may be improved. That is, the light emitting diode including the modified quantum dot may have improved charge transfer properties. The residue RS (FIG. 5) produced from the reaction of the ligand LD and the ligand scavenger RM may be removed after the step of providing heat to form an emission layer (S200). That is, after the step of providing heat to form an emission layer (S200), a step of cleaning residues (S300) may be performed. The residues RS (FIG. 5) produced from the reaction of the ligand LD and the ligand scavenger RM may be mostly removed in the cleaning step but may partially remain on the emission layer EL (FIG. 5).

Figure 13A:
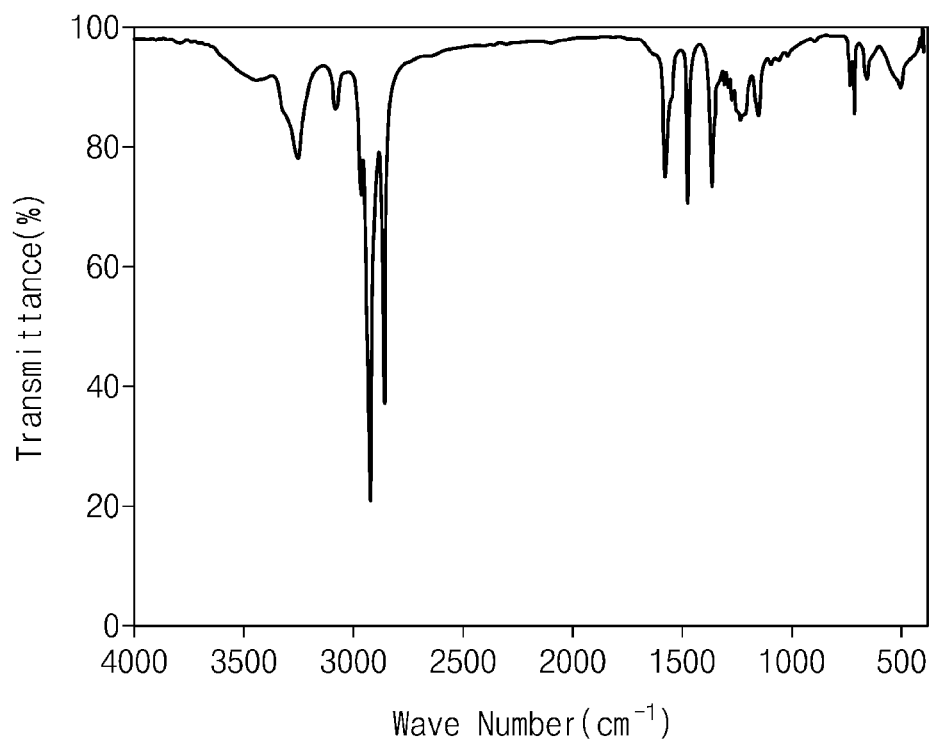
FIG. 13A and FIG. 13B are graphical depictions illustrating analysis results on a quantum dot composition before and after reaction, respectively.
Figure 13B:
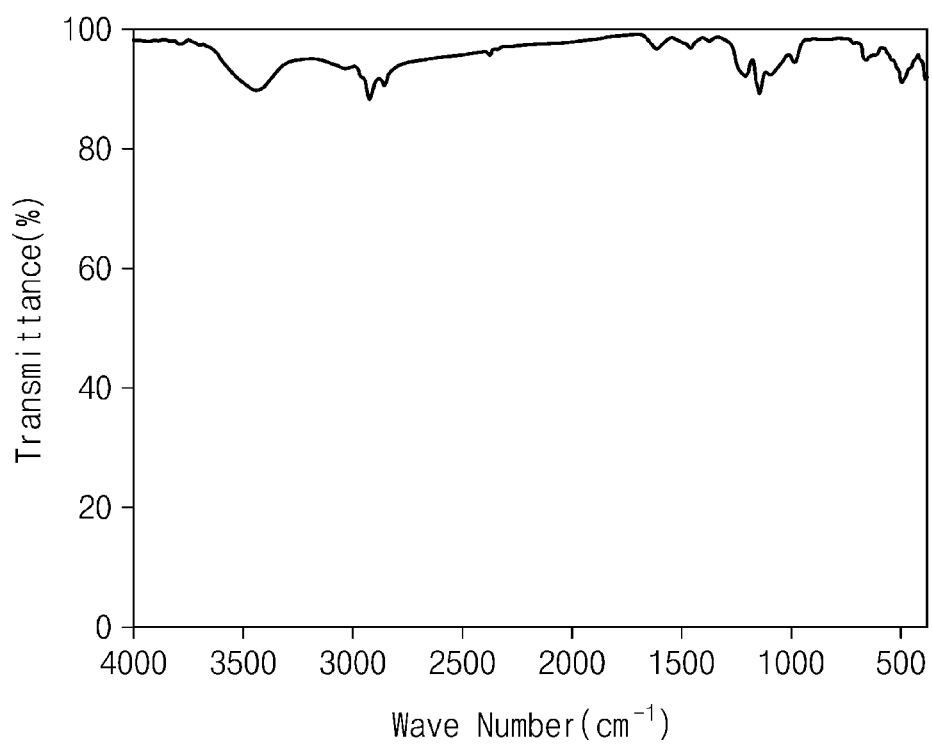

FIG. 13A and FIG. 13B are graphical depictions illustrating analysis results on a quantum dot composition before and after reaction, respectively.

FIG. 13A shows the analysis results on a quantum dot before providing the ligand scavenger and before performing the reaction. That is, FIG. 13A shows IR analysis results on a quantum dot in which the ligand is attached onto the surface thereof.

In addition, FIG. 13B shows IR analysis results on a modified quantum dot after providing a ligand scavenger and after performing the reaction between a ligand and a ligand scavenger. From the disappearance of peaks around the wavenumber of about 3000 $cm^{-1}$ and about 1,500 $cm^{-1}$ in FIG. 13B, which are shown in FIG. 13A, it was confirmed that the tail part of the ligand attached to the surface of the quantum dot was effectively removed by the ligand scavenger.

Figure 14:
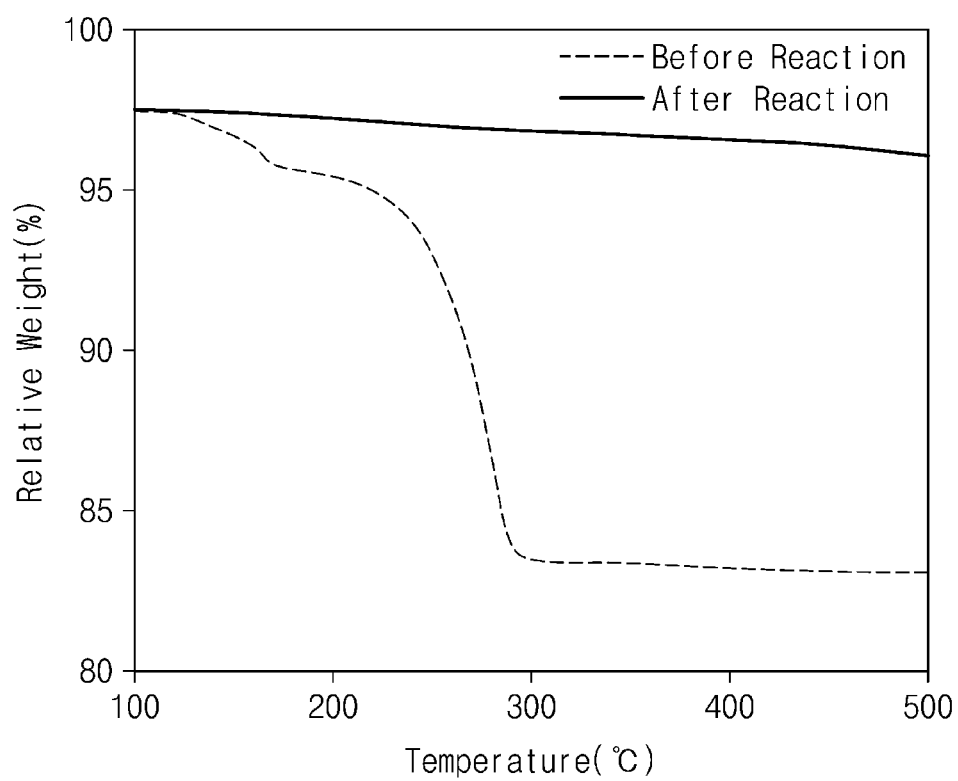
FIG. 14 is a graphical depiction illustrating thermal analysis results on a quantum dot composition before and after reaction.

FIG. 14 is a graphical depiction illustrating thermal analysis results on a quantum dot composition before and after reaction.

The thermal analysis results on the quantum dot composition was conducted by measuring the relative change of the weight of a specimen measured using thermogravimetric analysis (TGA).

In FIG. 14, the graph of the "before reaction" represented by a dotted line corresponds to thermal analysis results on a quantum dot composition not including a ligand scavenger. That is, the graph of the "before reaction" corresponds to thermal analysis results on a quantum dot in a combined state of a ligand at the surface. In FIG. 14, the graph of the "after reaction" represented by a solid line corresponds to thermal analysis results on a modified quantum dot in a state where a portion of the ligand attached onto the surface of the quantum dot is removed by the ligand scavenger.

Referring to the thermal analysis results on the "before reaction", it was found that a relative weight (%) was significantly decreased at about 250° C. or higher. This indicates that the ligand material attached onto the surface of the quantum dot is thermally decomposed. That is, in the quantum dot composition "before reaction", a ligand which is an organic material is attached onto the surface of the quantum dot, and such ligand is thermally decomposed at a high temperature and the weight thereof is significantly decreased at about 250° C. or higher.

In comparison, referring to the thermal analysis results on the "after reaction", the decrease of a weight is rarely shown at a temperature of about 300° C. or higher, and this is considered that most of the ligand attached onto the surface of the quantum dot has been removed through the reaction of the ligand scavenger and the ligand.

That is, in the quantum dot composition of some embodiments, a ligand scavenger is included, and the tail part of the ligand combined with the surface of the quantum dot may be effectively removed and a modified quantum dot may be provided.

The light emitting diode of an embodiment includes a modified quantum dot after performing the reaction between the ligand material and the ligand scavenger, and may show improved properties of charge transfer degree. In Table 1 below, the Comparative Example represents a light emitting diode including a quantum dot composition in which a ligand scavenger is not provided, that is, a light emitting diode including a quantum dot onto which a ligand is attached in an emission layer, and the Example represents a light emitting diode including a modified quantum dot from which a ligand attached onto the surface of the quantum dot is partially removed by a ligand scavenger, in an emission layer.

TABLE 1

| Division | Charge transfer degree ($cm^2V^{-1}S^{-1}$) |
| --- | --- |
| Comparative Example | $1.0*10^{-7}$ |
| Example | $1.0*10^{0}$ |

In the Comparative Example, the length of the ligand attached onto the quantum dot corresponds to about 18 Å. The charge transfer degree in the light emitting diode of an embodiment, including the modified quantum dot after the reaction with the ligand scavenger was improved by about $10^7$ times or more when compared with that of the light emitting diode of the Comparative Example.

According to the length of the ligand attached onto the quantum dot before the reaction with the ligand scavenger, the charge transfer degree in the light emitting diode having an emission layer including a quantum dot to which a ligand is attached, may be different. For example, with the decrease of the length of the ligand, the charge transfer degree in the light emitting diode may be improved.

It was confirmed that the light emitting diode of an embodiment shows improved device properties by including a modified quantum dot from which the tail part of a ligand combined at the surface of the quantum dot is effectively removed by a ligand scavenger, in an emission layer.

Figure 15:
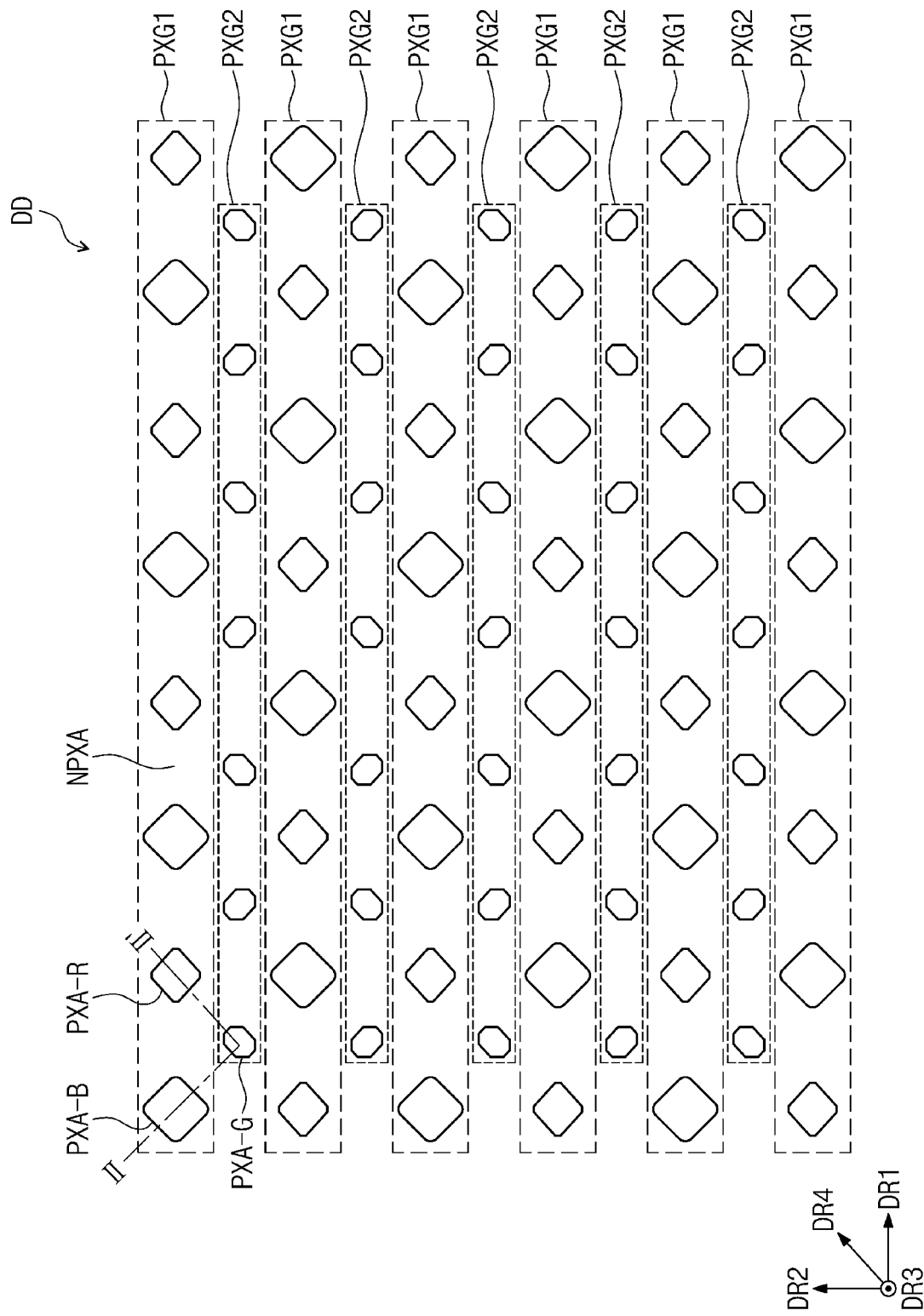
FIG. 15 is a plan view of an embodiment of the light emitting regions of a display device constructed according to principles of the invention.
Figure 16:
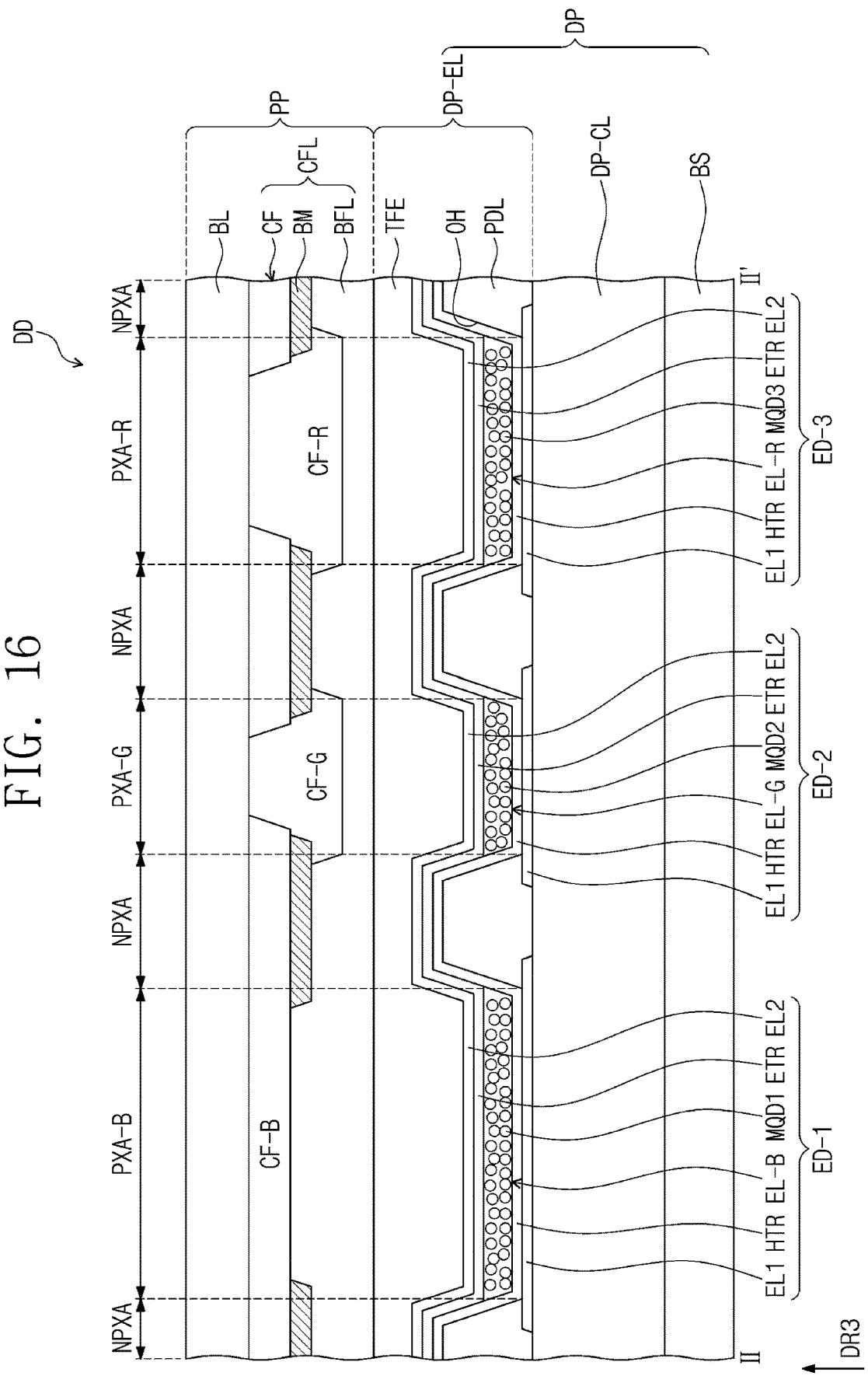
FIG. 16 is a cross-sectional view of the display device according to an embodiment taken along line II-II' of FIG. 15.

FIG. 15 is a plan view of an embodiment of the light emitting regions of a display device constructed according to principles of the invention. FIG. 16 is a cross-sectional view of the display device according to an embodiment taken along line II-II ' of FIG. 15. The display device DD of an embodiment includes a plurality of light emitting diodes ED-1, ED-2 and ED-3, s and the light emitting diodes ED-1, ED-2 and ED-3 may include emission layers EL-B, EL-G and EL-R including modified quantum dots MQD1, MQD2 and MQD3.

In addition, the display device DD of an embodiment may include a display panel DP including a plurality of light emitting diodes ED-1, ED-2 and ED-3 and a light controlling layer PP disposed on the display panel DP. In some embodiments, the light controlling layer PP may be omitted from the display device DD.

The display panel DP includes a base substrate BS, a circuit layer DP-CL provided on the base substrate BS, and a display device layer DP-EL. The display device layer DP-EL may include a pixel defining layer PDL, light emitting diodes ED-1, ED-2 and ED-3 disposed in the pixel defining layer PDL, and a sealing layer TFE disposed on the light emitting diodes ED-1, ED-2 and ED-3.

Referring to FIGS. 15 and 16, the display device DD may include a non-emission region NPXA and emission regions PXA-B, PXA-G and PXA-R. The emission regions PXA-B, PXA-G and PXA-R may be regions emitting light produced from the light emitting diodes ED-1, ED-2 and ED-3, respectively. The light emitting regions PXA-B, PXA-G and PXA-R may be separated from each other on a plane.

The emission regions PXA-B, PXA-G and PXA-R may be divided into a plurality of groups according to the color of light produced from the light emitting diodes ED-1, ED-2 and ED-3. In the display device DD of an embodiment shown in FIG. 15 and FIG. 16, three emission regions PXA-B, PXA-G and PXA-R emitting blue light, green light and red light are shown for illustration. For example, the display device DD of an embodiment may include a blue emission region PXA-B, a green emission region PXA-G and a red emission region PXA-R, which are distinguished from each other.

A plurality of light emitting diodes ED-1, ED-2 and ED-3 may emit lights in different wavelength regions. For example, in an embodiment, the display device DD may include a first light emitting diode ED-1 emitting blue light, a second light emitting diode ED-2 emitting green light, and a third light emitting diode ED-3 emitting red light. However, embodiments are not limited thereto, and the first to third light emitting diodes ED-1, ED-2 and ED-3 may emit light in the same wavelength region, or at least one thereof may emit light in a different wavelength region.

For example, the blue emission region PXA-B, the green emission region PXA-G, and the red emission region PXA-R of the display device DD may correspond to the first light emitting diode ED-1, the second light emitting diode ED-2, and the third light emitting diode ED-3, respectively.

The first emission layer EL-B of the first light emitting diode ED-1 may include a first modified quantum dot MQD1. The first modified quantum dot MQD1 may emit blue light, which is the first color light.

The second emission layer EL-G of the second light emitting diode ED-2 and the third emission layer EL-R of the third light emitting diode ED-3 may include a second modified quantum dot MQD2 and a third modified quantum dot MQD3, respectively. The second modified quantum dot MQD2 and the third modified quantum dot MQD3 may emit green light, which is the second color light, and red light, which is the third color light, respectively.

The first to third modified quantum dots MQD1, MQD2 and MQD3 may each have a quantum dot and a hydrophilic group combined at the surface of the quantum dot. With respect to the first to third modified quantum dots MQD1, MQD2 and MQD3, the same explanation on the modified quantum dot MQD referring to the light emitting diode of an embodiment may be applied.

The first to third emission layers EL-B, EL-G and EL-R including the first to third modified quantum dots MQD1, MQD2 and MQD3, respectively, may be derived from a quantum dot composition including a quantum dot, a ligand combined at the surface of the quantum dot, and a ligand scavenger having a nucleophilic reaction group.

In addition, each of the first to third emission layers EL-B, EL-G and EL-R may further include a residue derived from the reaction of the ligand and the ligand scavenger. The reaction residue may be a diamine compound or a dialkoxy compound.

In an embodiment, the first to third modified quantum dots MQD1, MQD2 and MQD3, included in the light emitting diodes ED-1, ED-2 and ED-3 may be formed using different core materials from each other. In addition, differently, the first to third modified quantum dots MQD1, MQD2 and MQD3 may be formed using the same core material, or two quantum dots selected among the first to third modified quantum dots MQD1, MQ2 and MQD3 may be formed using the same core material and the remaining one may be formed using a different core material.

In the display device DD of an embodiment, shown in FIG. 15 and FIG. 16, the areas of the emission regions PXA-B, PXA-G and PXA-R may be different from each other. In an embodiment, the area may be a planar area defined by a first direction axis DR1 and a second direction axis DR2.

The emission regions PXA-B, PXA-G and PXA-R may have different areas according to the color emitted from the emission layers EL-B, EL-G and EL-R of the light emitting diodes ED-1, ED-2 and ED-3. For example, referring to FIG. 15 and FIG. 16, in the display device DD of an embodiment, the blue emission region PXA-B corresponding to the first light emitting diode ED-1 which emits blue light may have the largest area, and the green emission region PXA-G corresponding to the second light emitting diode ED-2 which generates green light may have the smallest area. However, embodiments are not limited thereto, and the emission regions PXA-B, PXA-G and PXA-R may emit light other than blue light, green light and red light, or the emission regions PXA-B, PXA-G and PXA-R may have the same area. Otherwise, the emission regions PXA-B, PXA-G and PXA-R may be provided to have an area ratio different from that shown in FIG. 15.

Each of the emission regions PXA-B, PXA-G and PXA-R may be a region divided by a pixel defining layer PDL. The non-emission regions NPXA may be regions between neighboring emission regions PXA-B, PXA-G and PXA-R and may correspond to the pixel defining layer PDL. Each of the emission regions PXA-B, PXA-G and PXA-R may correspond to a representative pixel. The pixel defining layer PDL may divide the light emitting diodes ED-1, ED-2 and ED-3. The emission layers EL-B, EL-G and EL-R of the light emitting diodes ED-1, ED-2 and ED-3 may be disposed and divided in opening parts OH defined by the pixel defining layer PDL.

The pixel defining layer PDL may be formed using a polymer resin. For example, the pixel defining layer PDL may be formed by including a polyacrylate-based resin or a polyimide-based resin. In addition, the pixel defining layer PDL may be formed by additionally including an inorganic material in addition to a polymer resin. The pixel defining layer PDL may be formed by including a light absorbing material or may be formed by including a black pigment or a black dye. The pixel defining layer PDL formed by including the black pigment or the black dye may provide a black pixel defining layer. In forming the pixel defining layer PDL, carbon black may be used as the black pigment or the black dye, but the embodiments are not limited thereto.

In addition, the pixel defining layer PDL may be formed using an inorganic material. For example, the pixel defining layer PDL may be formed by including a silicon nitride ($SiN_x$), a silicon oxide ($SiO_x$), a silicon oxynitride ($SiO_xN_y$), etc. The pixel defining layer PDL may define the emission regions PXA-B, PXA-G and PXA-R. By the pixel defining layer PDL, the emission regions PXA-B, PXA-G and PXA-R and the non-emission region NPXA may be divided.

The light emitting diodes ED-1, ED-2 and ED-3 may include a first electrode EL1, a hole transport region HTR, emission layers EL-B, EL-G and EL-R, respectively, an electron transport region ETR, and a second electrode EL2. In the light emitting diodes ED-1, ED-2 and ED-3 included in the display device DD of an embodiment, the disclosure referring to FIG. 4 and FIG. 5 may be applied on the first electrode EL1, the hole transport region HTR, the electron transport region ETR and the second electrode EL2 except that the modified quantum dots MQD1, MQD2 and MQD3 included in the emission layers EL-B, EL-G and EL-R are different from each other.

The sealing layer TFE may cover the light emitting diodes ED-1, ED-2 and ED-3. The sealing layer TFE may be one layer or a laminated layer of a plurality of layers. The sealing layer TFE may be a thin film sealing layer. The sealing layer TFE protects the light emitting diodes ED-1, ED-2 and ED-3. The sealing layer TFE may cover the top surface of the second electrode EL2 disposed in the opening part OH, and may fill the opening part OH.

In FIG. 16, the hole transport region HTR and the electron transport region ETR are shown to cover the pixel defining layer PDL and provided as a common layer, but embodiments are not limited thereto. In the illustrated embodiment, the hole transport region HTR and the electron transport region ETR may be disposed in the opening part OH defined by the pixel defining layer PDL.

For example, in case of providing the hole transport region HTR and the electron transport region ETR as well as the emission layers EL-B, EL-G and EL-R by an inkjet printing method, the hole transport region HTR, the emission layers EL-B, EL-G and EL-R, the electron transport region ETR, may be provided corresponding to the opening part OH defined in the pixel defining layer PDL. However, the embodiments are not limited thereto, and as shown in FIG. 16, irrespective of the method of providing each functional layer, the hole transport region HTR and the electron transport region ETR may not be patterned but cover the pixel defining layer PDL and may be provided as one common layer.

In the display device DD of an embodiment shown in FIG. 16, the thicknesses of the emission layers EL-B, EL-G and EL-R of the first to third light emitting diodes ED-1, ED-2 and ED-3 are shown similar, but the embodiments are not limited thereto. For example, in an embodiment, the thicknesses of the emission layers EL-B, EL-G and EL-R of the first to third light emitting diodes ED-1, ED-2 and ED-3 may be different from each other.

Referring to FIG. 15, the blue emission regions PXA-B and the red emission regions PXA-R may be alternately arranged in a first direction axis DR1 to form a first group PXG1. The green emission regions PXA-G may be arranged in the first direction axis DR1 to form a second group PXG2.

The first group PXG1 and the second group PXG2 may be separately disposed in the direction of a second direction axis DR2. Each of the first group PXG1 and the second group PXG2 may be provided in plural. The first groups PXG1 and the second groups PXG2 may be alternately arranged along the second direction axis DR2.

One green emission region PXA-G may be separately disposed from one blue emission region PXA-B or one red emission region PXA-R in the direction of a fourth direction axis DR4. The direction of the fourth direction axis DR4 may be a direction between the direction of the first direction axis DR1 and the direction of the second direction axis DR2.

The arrangement structure of the emission regions PXA-B, PXA-G and PXA-R shown in FIG. 15 may be referred to as a pantile structure. However, the arrangement structure of the emission regions PXA-B, PXA-G and PXA-R in the display device DD according to an embodiment is not limited to the arrangement structure shown in FIG. 15. For example, in an embodiment, the emission regions PXA-B, PXA-G and PXA-R may be arranged in an elongate (stripe) configuration, wherein the blue emission region PXA-B, the green emission region PXA-G and the red emission region PXA-R are arranged by turns along the first direction axis DR1.

Referring to FIG. 3 and FIG. 15, the display device DD of an embodiment further includes a light controlling layer PP. The light controlling layer PP may block external light incident to the display panel DP from the exterior of the display panel DP. The light controlling layer PP may block a portion of the external light. The light controlling layer PP may achieve reflection preventing function for minimizing the reflection of the external light.

In an embodiment shown in FIG. 16, the light controlling layer PP may include a color filter layer CFL. That is, the display device DD of an embodiment may further include a color filter layer CFL disposed on the light emitting diodes ED-1, ED-2 and ED-3 of the display panel DP.

In the display device DD of an embodiment, the light controlling layer PP may include a base layer BL and a color filter layer CFL.

The base layer BL may be a member providing a base surface on which the color filter layer CFL, etc. is disposed. The base layer BL may be a glass substrate, a metal substrate, a plastic substrate, etc. However, the embodiments are not limited thereto, and the base layer BL may be an inorganic layer, an organic layer or a composite material layer.

The color filter layer CFL may include a light blocking part BM and a color filtering part CF. The color filtering part CF may include a plurality of filters CF-B, CF-G and CF-R. That is, the color filter layer CFL may include a first filter CF-B which transmits the first color light, a second filter CF-G which transmits the second color light, and a third filter CF-R which transmits the third color light. For example, the first filter CF-B may be a blue filter, the second filter CF-G may be a green filter, and the third filter CF-R may be a red filter.

The filters CF-B, CF-G and CF-R each may include a polymer photosensitive resin and a pigment or dye. The first filter CF-B may include a blue pigment or dye, the second filter CF-G may include a green pigment or dye, and the third filter CF-R may include a red pigment or dye.

While the embodiments are not limited thereto, the first filter CF-B may not include a pigment or a dye. The first filter CF-B may include a polymer photosensitive resin but not include a pigment or a dye. The first filter CF-B may be transparent. The first filter CF-B may be formed using a transparent photosensitive resin.

The light blocking part BM may be a black matrix. The light blocking part BM may be formed by including an organic light blocking material or an inorganic light blocking material, which includes a black pigment or a black dye. The light blocking part BM may prevent light leakage phenomenon and divide boundaries between adjacent filters CF-B, CF-G and CF-R.

The color filter layer CFL may further include a buffer layer BFL. For example, the buffer layer BFL may be a protection layer protecting the filters CF-B, CF-G and CF-R. The buffer layer BFL may be an inorganic layer including at least one inorganic material among silicon nitride, silicon oxide, and silicon oxynitride. The buffer layer BFL may be formed as a single layer or as a plurality of layers.

In an embodiment shown in FIG. 16, the first color filter CF-B of the color filter layer CFL is shown to be overlapped with the second filter CF-G and the third filter CF-R, but embodiments are not limited thereto. For example, the first to third filters CF-B, CF-G and CF-R may be divided by the light blocking part BM and non-overlapped with each other. In an embodiment, the first to third filters CF-B, CF-G and CF-R may be disposed correspondingly to the blue emission region PXA-B, green emission region PXA-G and red emission region PXA-R, respectively.

Unlike the diagram in FIG. 16, the display device DD of an embodiment may include a polarization layer instead of the color filter layer CFL as the light controlling layer PP. The polarization layer may block external light incident to the display panel DP. The polarization layer may partially block the external light.

In addition, the polarization layer may decrease reflected light at the display panel DP by the external light. For example, the polarization layer may carry out blocking function of reflected light in case where the incident light from the exterior of the display device DD is incident to the display panel DP and then reflected again. The polarization layer may be a circular polarizer having reflection preventing function or the polarization layer may include a λ/4 phase retarder from a linear polarizer. The polarization layer may be disposed on the base layer BL and exposed, or disposed under the base layer BL.

The display device of an embodiment may show excellent luminous efficiency by improving charge injection properties which is inhibited by a ligand, through including a modified quantum dot having a modified functional group by removing a portion of the ligand in an emission layer. That is, the display device of an embodiment includes an emission layer formed from a quantum dot composition including a ligand scavenger, and the emission layer includes a modified quantum dot from which the tail part of a ligand is removed by the ligand scavenger, thereby showing excellent luminous efficiency properties.

Figure 17:
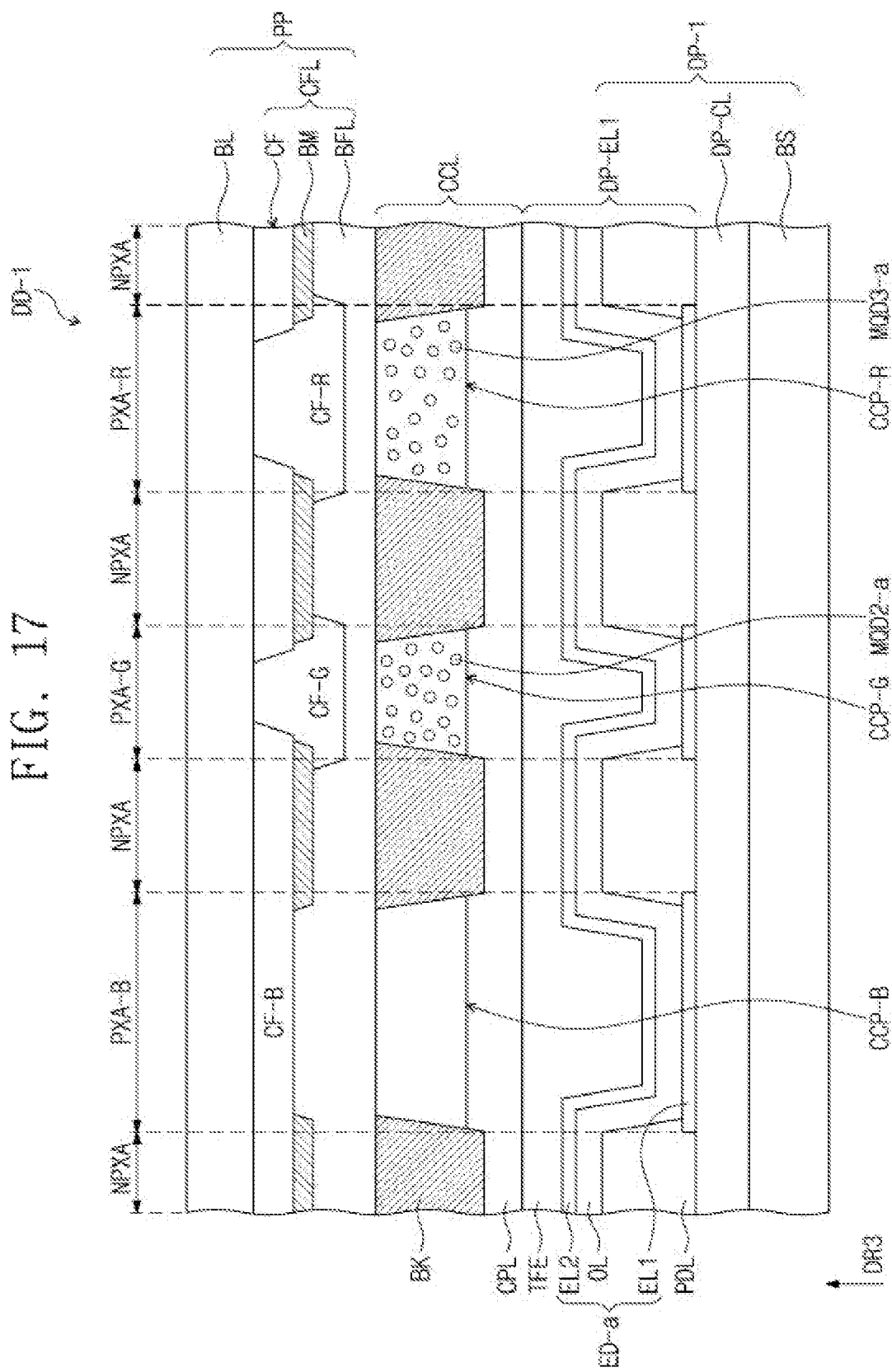
FIG. 17 is a cross-sectional view of another embodiment of a display device constructed according to principles of the invention.

FIG. 17 is a cross-sectional view of another embodiment of a display device constructed according to principles of the invention.

In explaining on the display device DD-1 of an embodiment, the overlapping contents with the explanation referring to FIG. 1 to FIG. 16 will not explained again to avoid redundancy and the explanation will be focused on different points.

Referring to FIG. 17, the display device DD-1 of an embodiment may include a color conversion layer CCL disposed on a display panel DP-1. In addition, the display device DD-1 may further include a color filter layer CFL. The color filter layer CFL may be disposed between a base layer BL and the color conversion layer CCL.

The display panel DP-1 may be an emission type display panel. For example, the display panel DP-1 may be an organic electroluminescence display panel, or a quantum dot emitting display panel.

The display panel DP-1 may include a base substrate BS, a circuit layer DP-CL provided on the base substrate BS, and a display device layer DP-EL1.

The display device layer DP-EL1 includes a light emitting diode ED-a, and the light emitting diode ED-a may include oppositely disposed first electrode EL1 and second electrode EL2, and a plurality of layers OL disposed between the first electrode EL1 and the second electrode EL2. The plurality of layers OL may include a hole transport region HTR (FIG. 4), an emission layer EL (FIG. 4), and an electron transport region ETR (FIG. 4). On the light emitting diode ED-a, a sealing layer TFE may be disposed.

In the light emitting diode ED-a, the same explanation referring to FIG. 4 above may be applied for the first electrode EL1, the hole transport region HTR, the electron transport region ETR, and the second electrode EL2. However, in the light emitting diode ED-a included in the display panel DP-1 of an embodiment, the emission layer may include a host and a dopant, which are materials for organic electroluminescence, or may include the modified quantum dot explained referring to FIG. 1 to FIG. 16. In the display panel DP-1 of an embodiment, the light emitting diode ED-a may emit blue light.

The color conversion layer CCL may include a plurality of barrier parts BK separately disposed from each other and color controlling parts CCP-B, CCP-G and CCP-R, which are disposed between the barrier parts BK. The barrier part BK may be formed by including a polymer resin and a hydrophobic additive. The barrier part BK may be formed by including a light absorbing material or may be formed by including a pigment or a dye. For example, the barrier part BK may be formed by including a black pigment or a black dye to realize a black barrier part. During forming the black barrier part, carbon black, etc. may be used as the black pigment or the black dye, but the embodiments are not limited thereto.

The color conversion layer CCL may include a first color controlling part CCP-B for transmitting first color light, a second color controlling part CCP-G including a second modified quantum dot MQD2-a for converting the first color light into second color light, and a third color controlling part CCP-R including a third modified quantum dot MQD3-a for converting the first color light into third color light. The second color light may be light in a longer wavelength region than the first color light, and the third color light may be light in a longer wavelength region than the first color light and the second color light. For example, the first color light may be blue light, the second color light may be green light, and the third color light may be red light. For the modified quantum dots MQD2-a and MQD3-a included in the color controlling parts CCP-G and CCP-R, the same explanation on the modified quantum dots MQD2 and MQD3 used in the emission layers EL-G and EL-R shown in FIG. 16 may be applied.

The first color controlling part CCP-B may include a dispersing element. The first color controlling part CCP-B may not include a modified quantum dot but may include the dispersing element. In addition, in addition to the first color controlling part CCP-B, the second color controlling part CCP-G and the third color controlling part CCP-R may further include a dispersing element in addition to the modified quantum dots MQD2 and MQD3.

The dispersing element may include at least one of $TiO_2$, ZnO, $Al_2O_3$, $SiO_2$, hollow silica or a polystyrene particle. The dispersing element may include any one of $TiO_2$, ZnO, $Al_2O_3$, $SiO_2$, hollow silica or a polystyrene particle, or may be a mixture of two or more materials selected from $TiO_2$, ZnO, $Al_2O_3$, $SiO_2$, hollow silica or a polystyrene particle formed using a polystyrene resin. For example, the color controlling parts CCP-B, CCP-G and CCP-R of the color conversion layer CCL according to an embodiment may include $TiO_2$ as the dispersing element.

The color conversion layer CCL may further include a capping layer CPL. The capping layer CPL may be disposed on the color controlling parts CCP-B, CCP-G and CCP-R, and the barrier part BK. The capping layer CPL may play the role of preventing the penetration of moisture and/or oxygen (hereinafter, will be referred to as "moisture/oxygen"). The capping layer CPL may be disposed on the color controlling parts CCP-B, CCP-G and CCP-R and block the exposure of the color controlling parts CCP-B, CCP-G and CCP-R to moisture/oxygen. The capping layer CPL may include at least one inorganic layer.

The display device DD-1 may include a color filter layer CFL disposed on the color conversion layer CCL, and the same explanation referring to FIG. 16 may be applied to the color filter layer CFL and the base layer BL.

The display device DD-1 may include modified quantum dots MQD2-*a* and MQD3-*a* to which a functional group of which ligand is partially removed is attached on the surface thereof, in the color conversion layer CCL, and may show excellent color reproducibility.

In addition, in the display device DD-1, the light emitting diode ED-a of the display panel DP-1 may include an emission layer including a modified quantum dot of which ligand is partially removed, and in some embodiments, the display panel DP-1 may show excellent luminous efficiency.

Quantum dot composition made according to the principles and embodiments of the invention include a quantum dot that is combined with a ligand and a ligand scavenger having a nucleophilic reaction group and may be used as a material for an emission layer with improved luminous efficiency properties. The light emitting diode and the display device of some embodiments include a modified quantum dot material having modified surface properties in an emission layer with improved luminous efficiency.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A quantum dot composition comprising:
    a quantum dot;
    a ligand combined with a surface of the quantum dot; and
    a ligand scavenger having a nucleophilic reaction group,
    wherein the ligand comprises:
        a head part combined with the surface of the quantum dot;
        a tail part comprising an alkyl group of 1 to 20 carbon atoms; and
        wherein the head part has a dithio acid group or a carboxylic acid group.

2. The quantum dot composition of claim 1, wherein the ligand comprises at least one of HO(O)—C—NH—R, HS(S)—C—NH—R, HO(O)—C—N-$R_2$, HS(S)—C—N—$R_2$, HO(O)—C—O—R, HS(S)—C—O—R, HO(O)—C—[C(O)O—C(O)O]$_n$—H, or HS(S)—C[C(O)O—C(O)O]$_n$—H, where R is an alkyl group of 1 to 20 carbon atoms, and n is an integer of 1 to 10.

3. The quantum dot composition of claim 1, wherein the ligand scavenger comprises at least one of $NH_2$—$R_a$, NH—$(R_a)_2$, N—$(R_a)_3$, OH—$R_a$, or O—$(R_a)_2$, where $R_a$ is an alkyl group of 1 to 20 carbon atoms.

4. The quantum dot composition of claim 1, further comprising an organic solvent.

5. The quantum dot composition of claim 1, wherein the ligand scavenger is configured to induce a nucleophilic attack reaction on the ligand.

6. The quantum dot composition of claim 1, wherein the quantum dot comprises a semiconductor nanocrystal including a core and a shell wrapping the core.

7. A quantum dot composition comprising:
    a quantum dot;
    a ligand combined with a surface of the quantum dot; and
    a ligand scavenger having a nucleophilic reaction group,
    wherein the ligand scavenger and the ligand have a molar ratio of at least about 1:1, wherein the moles of the ligand scavenger exceed the moles of the ligand.

8. A light emitting diode comprising:
    a first electrode;
    a hole transport region disposed on the first electrode;
    an emission layer disposed on the hole transport region and comprising a modified quantum dot having a hydrophilic group;
    an electron transport region disposed on the emission layer; and
    a second electrode disposed on the electron transport region,
    wherein
    the emission layer is made from a quantum dot composition comprising a quantum dot, a ligand combined with a surface of the quantum dot, and a ligand scavenger having a nucleophilic reaction group,
    the ligand comprises at least one of HO(O)—C—NH—R, HS(S)—C—NH—R, HO(O)—C—N—$R_2$, HS(S)—C—N—$R_2$, HO(O)—C—O—R, HS(S)—C—O—R, HO(O)—C—[C(O)O—C(O)O]$_n$—H, or HS(S)—C—[C(O)O—C(O)O]$_n$—H, where: R is an alkyl group of 1 to 20 carbon atoms, and n is an integer of 1 to 10; and
    the ligand scavenger comprises at least one of $NH_2$—$R_a$, NH—$(R_2)_2$, N—$(R_2)_1$, OH—$R_a$, or 0-$(R_a)_2$, where: $R_a$ is an alkyl group of 1 to 20 carbon atoms.

9. The light emitting diode of claim 8, wherein the modified quantum dot comprises:
    a quantum dot comprising a core and a shell wrapping the core; and
    the hydrophilic group which is combined with a surface of the quantum dot.

10. The light emitting diode of claim 8, wherein the hydrophilic group comprises a thiol group or a hydroxyl group.

11. The light emitting diode of claim 8, wherein the emission layer further comprises a residue made by reacting the ligand and the ligand scavenger.

12. The light emitting diode of claim 11, wherein the residue comprises a diamine compound or a dialkoxy compound.

* * * * *